(12) United States Patent
Verschuuren et al.

(10) Patent No.: US 8,172,968 B2
(45) Date of Patent: May 8, 2012

(54) METHOD AND SYSTEM FOR CONTACTING OF A FLEXIBLE SHEET AND A SUBSTRATE

(75) Inventors: Marcus Antonius Verschuuren, Eindhoven (NL); Mischa Megens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 180 days.

(21) Appl. No.: 12/522,609

(22) PCT Filed: Jan. 11, 2008

(86) PCT No.: PCT/IB2008/050093
§ 371 (c)(1),
(2), (4) Date: Jul. 9, 2009

(87) PCT Pub. No.: WO2008/087573
PCT Pub. Date: Jul. 24, 2008

(65) Prior Publication Data
US 2009/0314414 A1    Dec. 24, 2009

(30) Foreign Application Priority Data
Jan. 16, 2007   (EP) ..................... 07100622

(51) Int. Cl.
*B32B 41/00*   (2006.01)
(52) U.S. Cl. .......... 156/64; 156/350; 156/351; 156/378; 156/379; 101/133; 101/214; 101/287; 101/297; 101/319; 101/322; 101/327; 101/368; 101/485; 101/486; 438/458; 438/464; 438/973; 438/976; 271/13; 271/15; 271/17; 271/10.12; 271/226; 271/228; 271/229; 271/237; 271/240; 271/241; 271/261; 399/395; 400/579; 400/630; 400/631; 400/632; 400/632.1; 400/633; 400/633.2

(58) Field of Classification Search ............... 156/64, 156/350, 351, 378, 379; 101/133, 214, 287, 101/297, 319, 322, 327, 368, 485, 486; 438/458, 438/464, 973, 976; 400/579, 630, 631, 632, 400/632.1, 633, 633.2; 271/13, 15, 17, 10.12, 271/226, 228, 229, 237, 240, 241, 261
See application file for complete search history.

(56) References Cited

U.S. PATENT DOCUMENTS

| 5,669,303 A | 9/1997 | Maracas et al. |
| 6,792,856 B2 * | 9/2004 | Hall et al. ................... 101/368 |
| 2004/0011231 A1 | 1/2004 | Hall et al. |

(Continued)

FOREIGN PATENT DOCUMENTS

EP   0794016 A1   9/1997

(Continued)

*Primary Examiner* — Katarzyna Wyrozebski Lee
*Assistant Examiner* — Joshel Rivera
(74) *Attorney, Agent, or Firm* — Larry Liberchuk

(57) ABSTRACT

The invention relates to a method for contacting a flexible sheet to a first element with improved lateral alignment. The method includes a step of measuring a first lateral misalignment after establishing a first contact between the flexible sheet and either of the first element and a sheet parking surface called anchor in the first stage. If the 5 misalignment exceeds a predetermined threshold the flexible sheet is parked at the anchor such that it is not in contact with the first element, and the relative position of the first element and the anchor is altered during the second stage for correcting the mismatch during a contact between the flexible sheet and the first element to be established within the next step of the method. During the steps of shifting the contact point to obtain the second stage 10 the contacting process is more accurate and reproducible than the process for establishing the initial contact. The invention also relates to an apparatus for executing the method, and the use of the method and apparatus for the manufacture of devices.

11 Claims, 16 Drawing Sheets

U.S. PATENT DOCUMENTS

2004/0021866 A1 2/2004 Watts et al.
2004/0197712 A1 10/2004 Jacobson et al.

FOREIGN PATENT DOCUMENTS

| WO | 03099463 | A2 | 12/2003 |
| WO | 2005031855 | A1 | 4/2005 |
| WO | 2006117745 | A2 | 11/2006 |
| WO | 2008053418 | A2 | 5/2008 |
| WO | 2008068701 | A2 | 6/2008 |

* cited by examiner

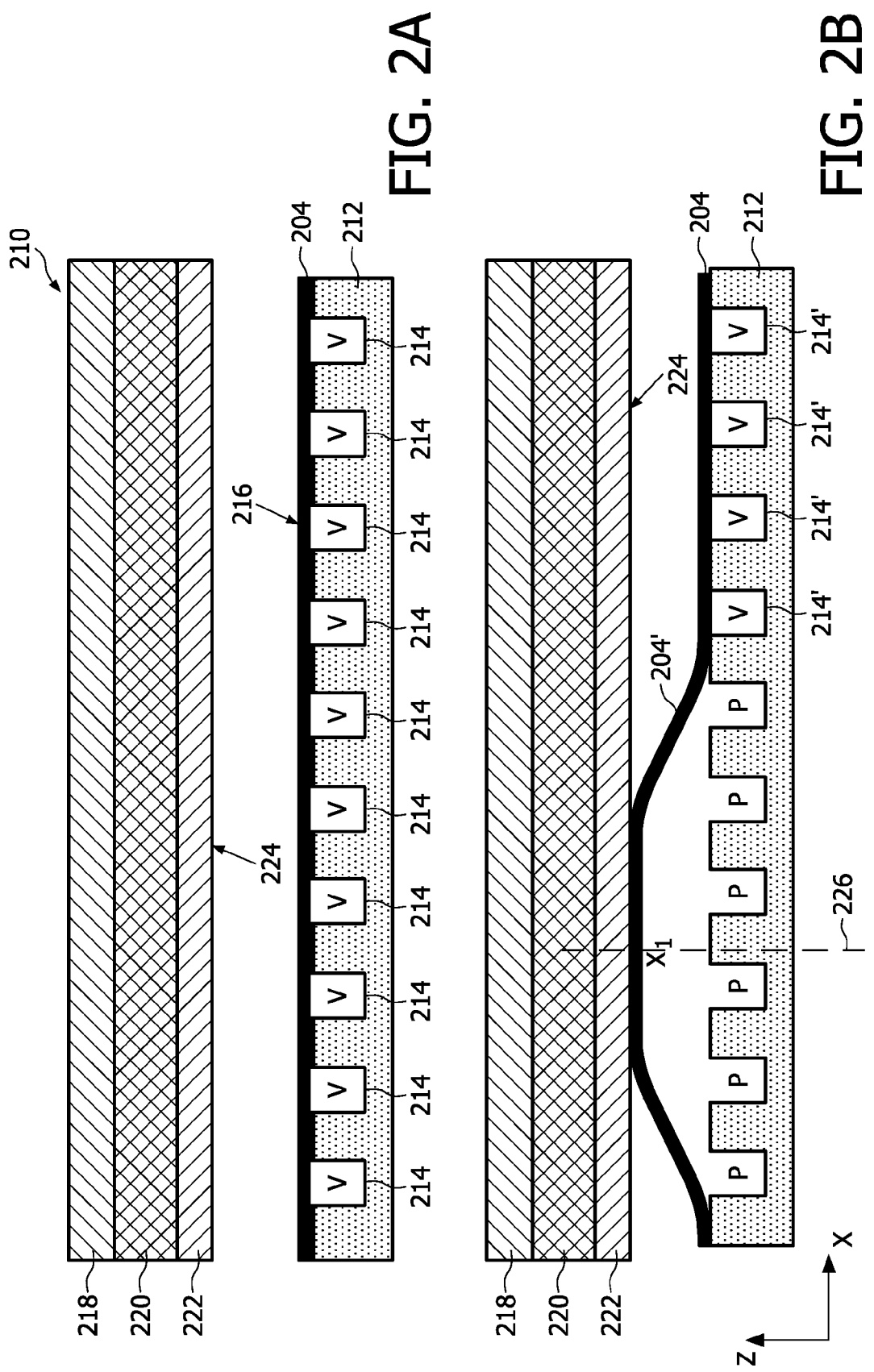

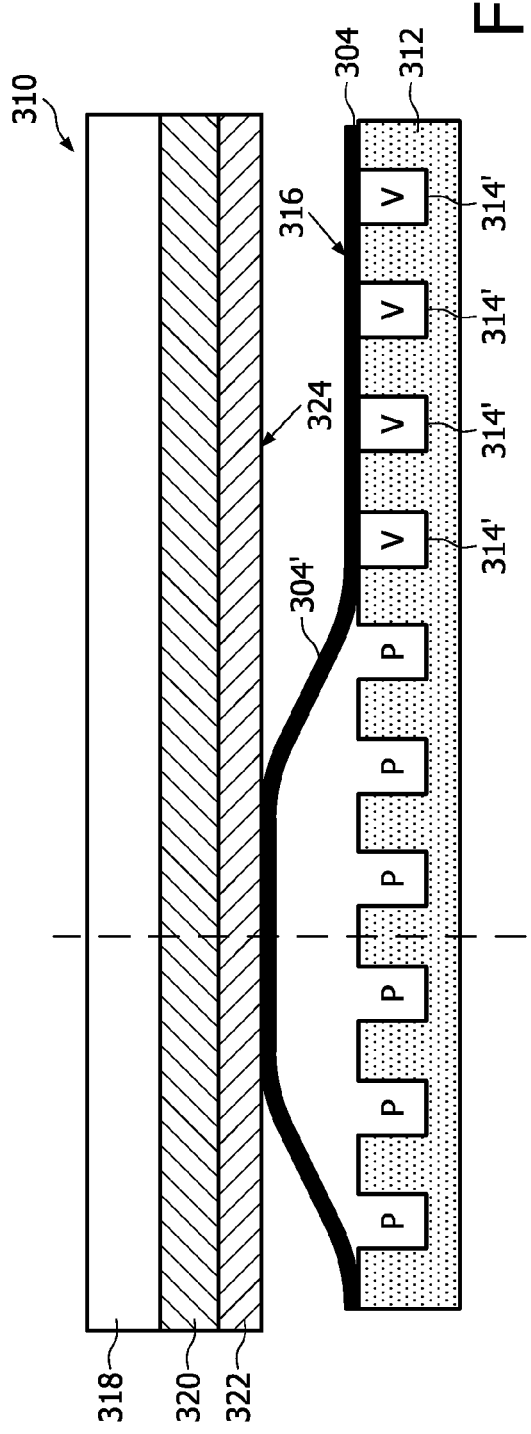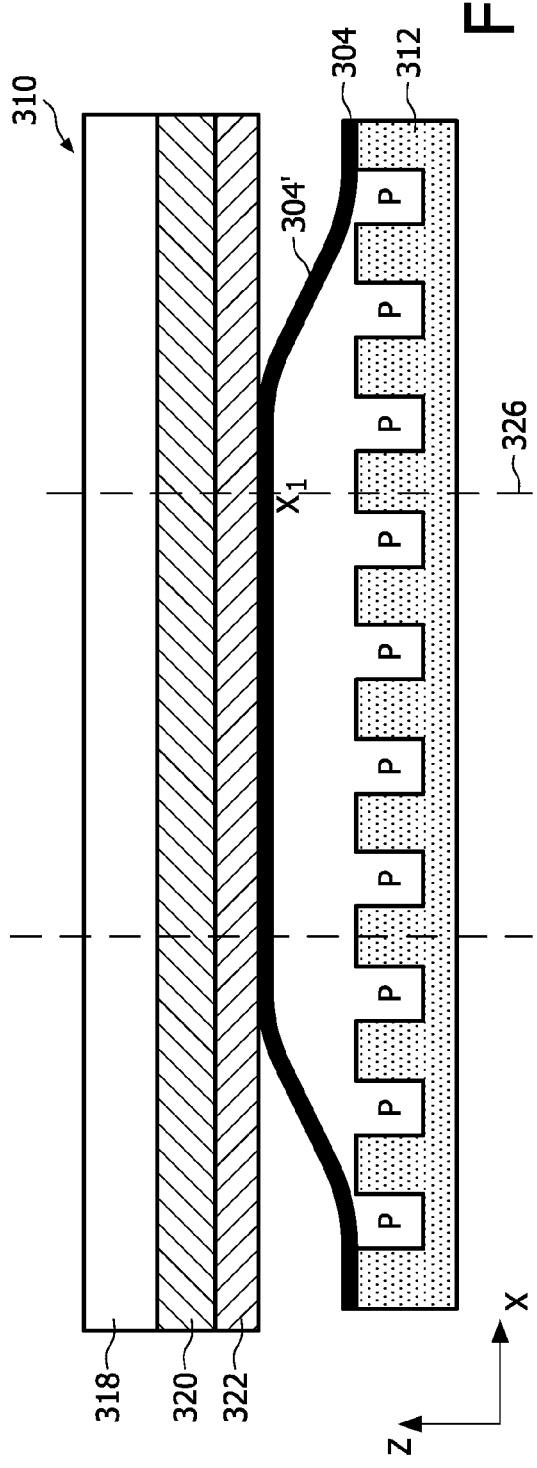

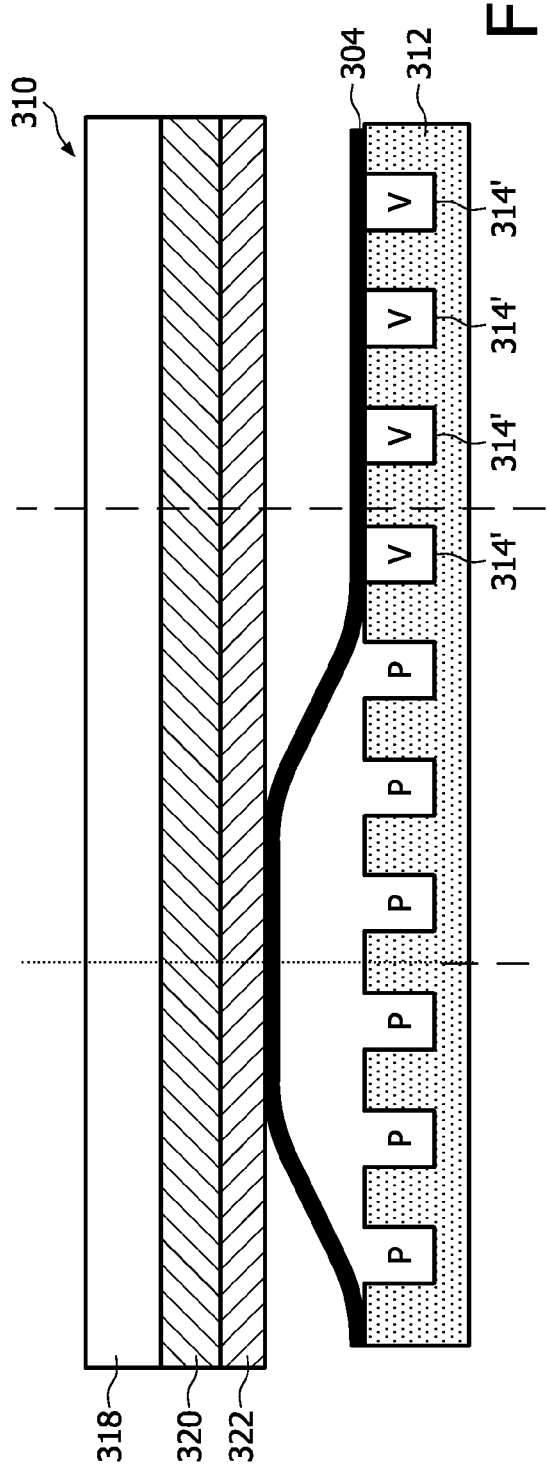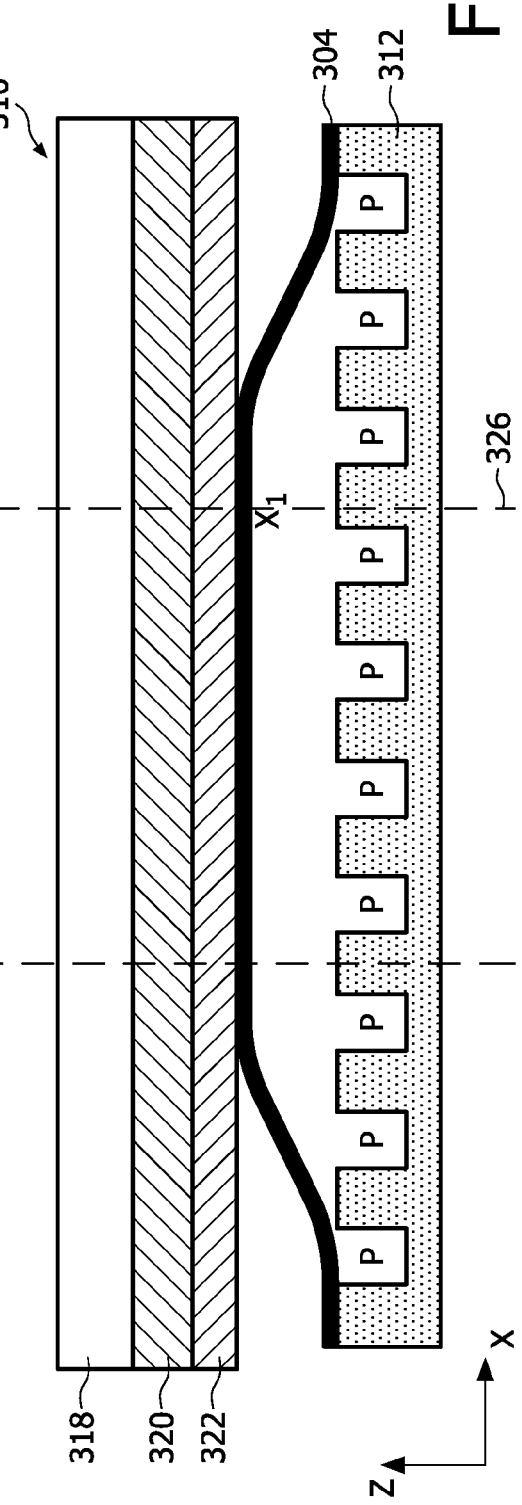

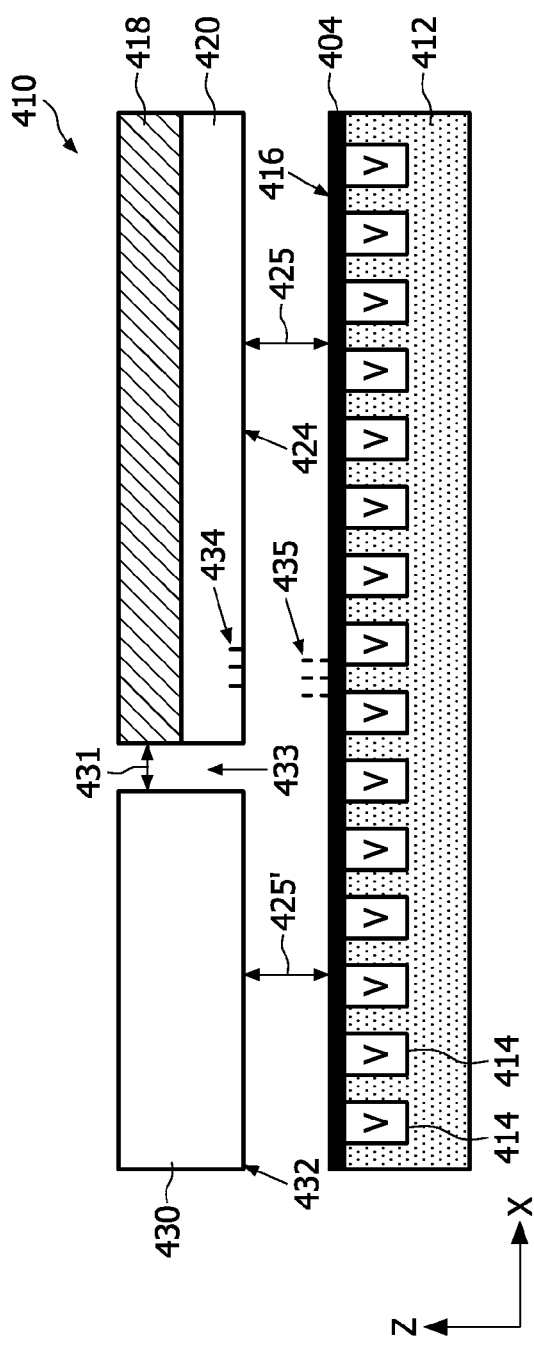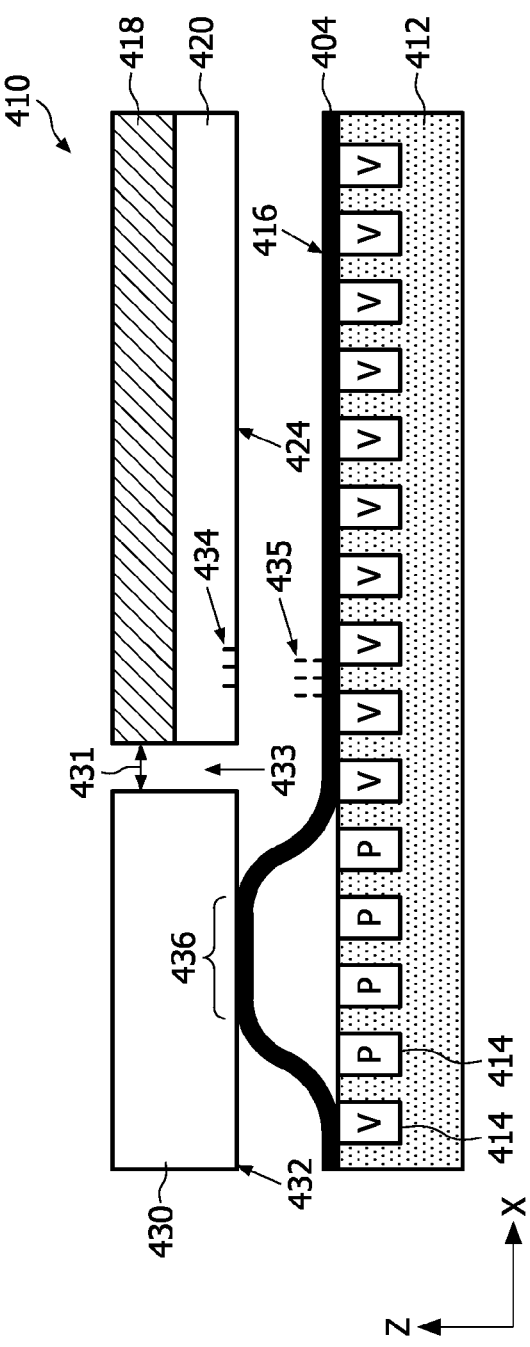

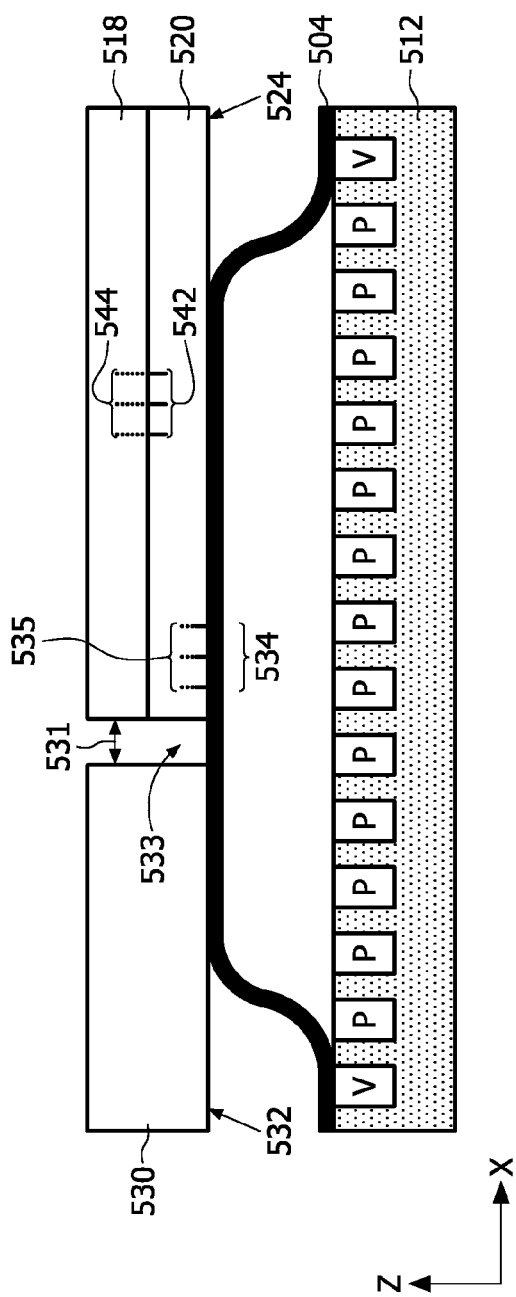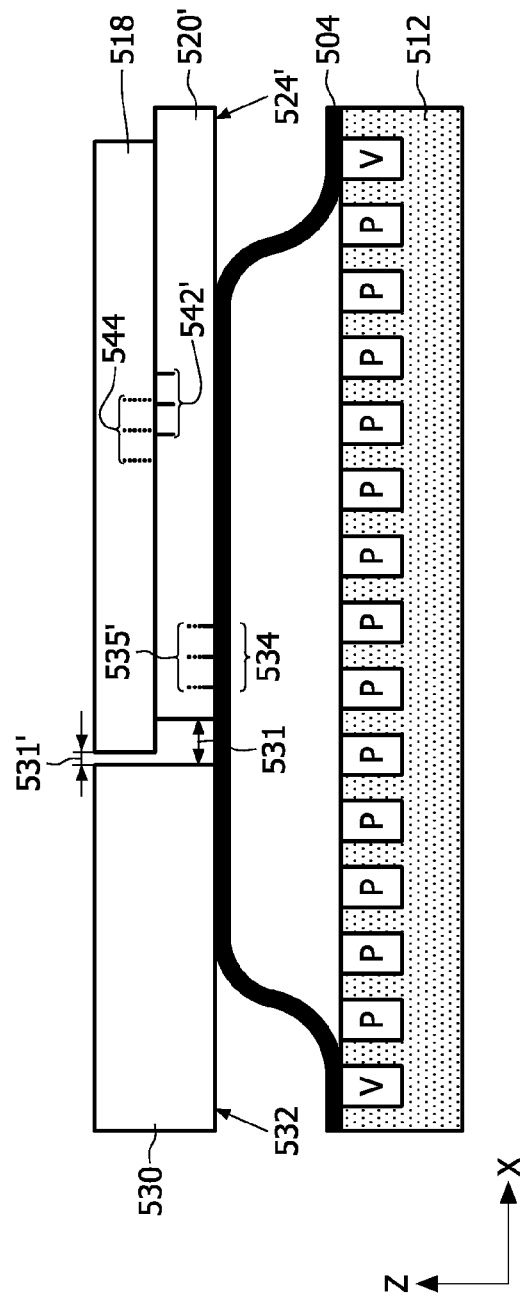

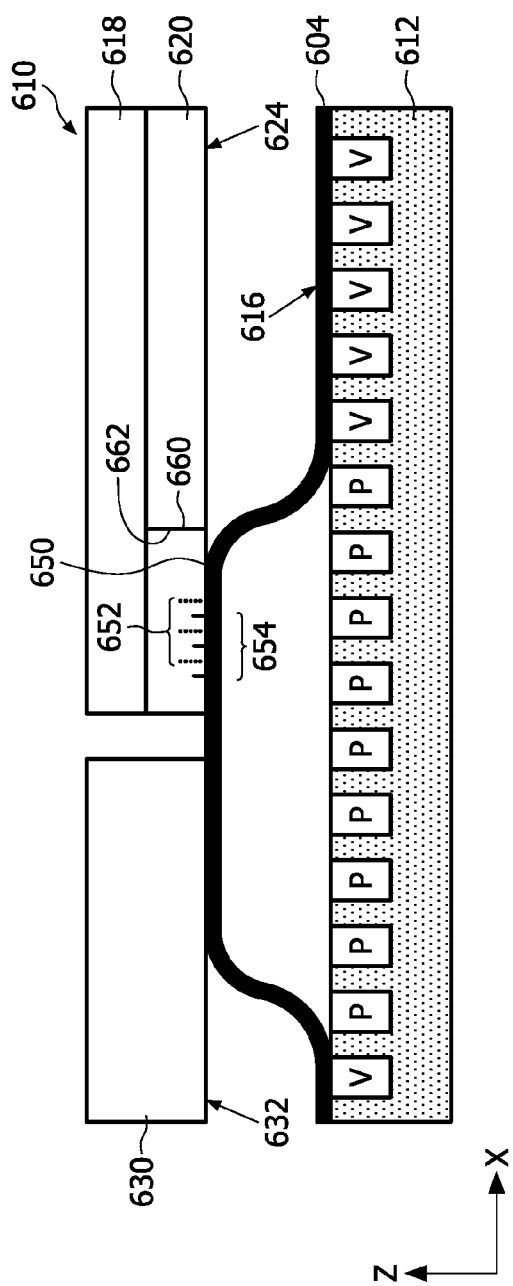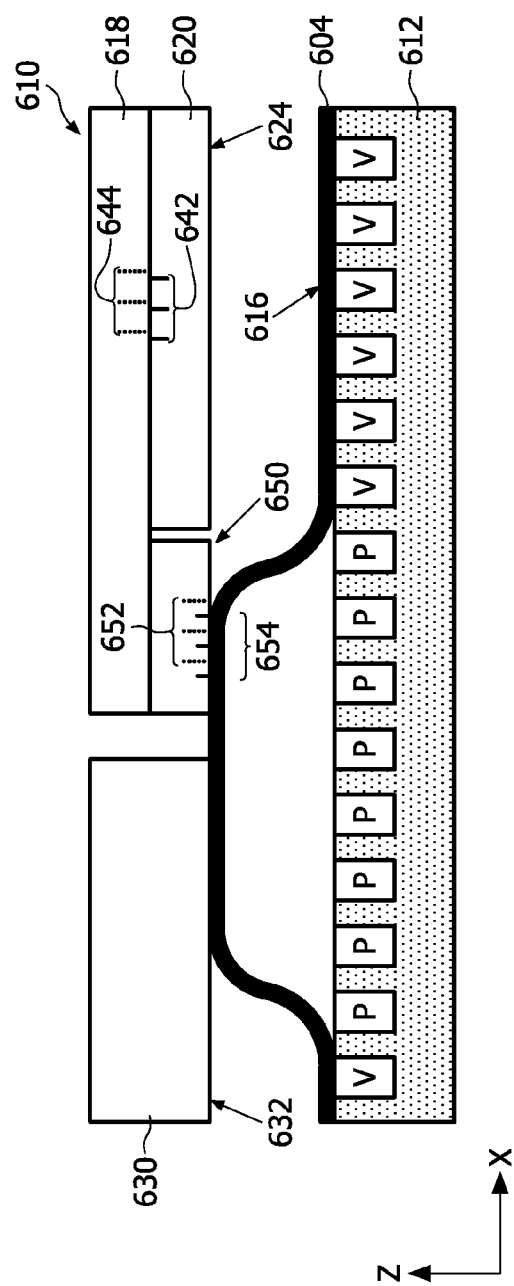

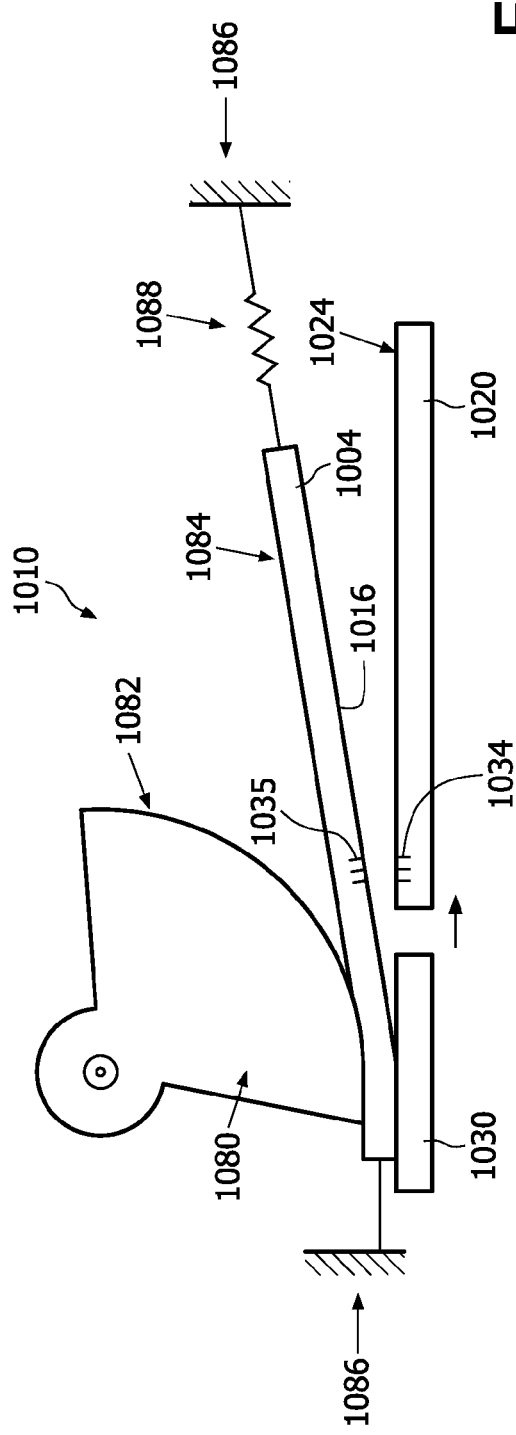

METHOD AND SYSTEM FOR CONTACTING OF A FLEXIBLE SHEET AND A SUBSTRATE

FIELD OF THE INVENTION

The invention relates to a method and system for contacting of a sheet surface of a flexible sheet to a first contact surface of a first element. The invention further relates to a method for the manufacture of a device comprising a plurality of layers, wherein at least two of the plurality of layers are mutually laterally aligned. The invention also relates to a computer program for enabling a system to execute the method according to the invention.

BACKGROUND OF THE INVENTION

In EP0794016A1 is disclosed an apparatus and method for stamping the surface of a substrate with a flexible stamp, having a stamping surface that includes a predetermined pattern. The method includes the steps of placing the substrate on a support structure, wetting the stamping surface with a solution containing a self-assembled monolayer-forming molecular species, aligning alignment patterns on the flexible stamp with alignment patterns on the surface of the substrate prior to controllably contacting the wetted stamping surface with the substrate surface such that contact commences at the centre of the flexible stamp and proceeds outwardly in a controlled manner by changing a pressure differential across the flexible stamp. The process of controllably contacting the wetted stamping surface includes the establishment of an initial contact between the surface and the centre of the flexible stamp followed by proceeding of the formation of the contact outwardly in a controlled manner from the initial contact. The method describes a method for lateral alignment of the flexible stamp to the substrate before contacting the stamp to the substrate.

The method has the disadvantage that the lateral alignment of the flexible stamp and the surface of the substrate is inaccurate especially when alignment is desired at micrometer scale or less.

It is an object of the invention to provide a method and apparatus with which improved lateral alignment between two surfaces that are brought in physical contact is achieved.

SUMMARY OF THE INVENTION

The invention is defined by the independent claims. The dependent claims define advantageous embodiments.

In a first aspect of the invention a method is provided for contacting of a sheet surface of a flexible sheet and a first contact surface of a first element according to claim 1.

The term sheet denotes that this part has a thickness less than the lateral dimensions and flexible means that the stiffness of the sheet towards deformation in the lateral dimensions of the sheet is higher than that towards deformation in the direction perpendicular to the lateral dimensions, i.e. in the thickness direction. Flexible sheets includes sheets comprising all sorts of materials such as metal, ceramics (glass), organic materials or composites including and in particular laminates as long as they are deformable to some extent. The extent of deformation is inter alia dependent on the mechanical properties of the sheet as determined by its material composition in relation to the dimensions such as thickness of the sheet. For example a sheet of elastic material will tolerate deformation at larger sheet thickness than sheets of comparable thickness comprising non-elastic material.

The term 'the first element' is meant to include any sort of substrate, being rigid or flexible, as well as parts of an apparatus where appropriate, as will be elucidated in the description of embodiments.

The method enables establishment of contact between the sheet surface and the first contact surface with accurate and/or reproducible lateral alignment, by using a sequence of steps and stages for correcting a lateral misalignment obtained after establishment of an initial contact between the sheet surface and at least one of the first contact surface or the anchor surface in a first stage. According to the invention, the lateral misalignment between the sheet surface and any one of the surfaces with which it is in contact is determined in this first stage. In the second stage the sheet surface is temporarily released from the first contact surface, but kept in contact with the anchor surface such that the relative position of the first contact surface and the anchor surface can be altered freely. This contact between sheet surface and anchor surface is essential since it fixes the lateral position of the sheet surface with respect to the first contact surface. Therewith the contact also results in the adjustment of the relative position to have the effect of altering the relative position of the sheet surface and the first contacting surface. Hence, the adjustment of relative position may be done such as to counterbalance the misalignment to below a chosen threshold value. In the third stage, the initial contact is re-established.

The improved lateral alignment in the third stage is obtained since once the mismatch has been determined, any method steps used for (re)-establishing a contact is more accurate, or reproducible within a certain lateral dimension than that of the first contacting process for establishing the initial contact, i.e. the first stage. Multiple ways of achieving this will be elucidated in the description of embodiments.

Thus according to the invention it is the combination of an anchor surface, necessary to establish the second stage, with a second contacting process that is more accurate than a first contacting process for establishing the third stage, which enables that the method results in lateral alignment improvement. It is important to keep the flexible contact surface of the sheet in contact with the anchor surface in order to divide stress forces occurring during the processes over the entire area of the contact between sheet and anchor surface. In addition, in this way contact to the sheet surface is always made near the contact front, therewith providing relatively stress less conditions.

The first stage of the method may comprise any one of a number of situations wherein the flexible sheet is attached to the anchor, to the first element or both. Either of these starting situations leads to the improved lateral alignment and some of the starting situations have specific advantages as described here below and in the description of embodiments.

In an embodiment the second contacting process includes gradual establishment of the contact. The embodiment provides a contacting process that is more accurate than the first contacting process. This is due to the fact that during the second contacting process of this embodiment any new contact is always established very close to a point, being part of the contact front, where contact is already present. Deformation of the sheet in between the point of contact and the point where contact is to be established is therewith relatively low, increasing accuracy and reproducibility of forming the contact significantly.

In a preferred variation of the previous embodiment the contact front displaces without external forces being exerted. External forces being gravity, or (electro)mechanical forces not having their origin from either of the sheet or the first element. Internal forces include all types of molecular forces resulting in an attractive force between the sheet and the first element such that the contact front advances. This embodiment has the advantage that the deformation of the sheet mentioned here before is only determined by small forces operating near the contact front and originating from the material system at hand, such that sheet deformation is minimum and accuracy and reproducibility of repeated contact establishment increased.

In an embodiment the anchor surface and the first contacting surface at their nearest edges reside in the same virtual plane during performing of the second contacting processes. This has the advantage that during extension of the contact over the gap between anchor surface and first contact surface step height differences between these surfaces are reduced or eliminated, therewith providing more accurate and reproducible formation (extension of the contact over the gap) of contact during the second contacting process.

In an advantageous variation of the previous embodiment, the edges of the anchor surface and the first contacting surface are at least partly digitated, the digits of the digitated parts being positioned at least partly in between each other. This embodiment is advantageous in that during the process of establishing contact which extends over the gap between the anchor surface and the first contact surface using the second contact process, the gap does not need to be spanned simultaneously along the entire contact front. A second advantage is that when a contact process is used that relies on internal forces only and such forces would be not adequate to let the advancing of the contact front extend over the gap, then the digits ensure that there is always contact between part of the sheet surface and either the anchor surface or the first contact surface during crossing of the gap. The digits preferably are designed such that adjustment of relative position of the anchor surface and the first contact surface is enabled in all lateral directions and/or in plane relative rotation.

In an embodiment, the distance, being the gap width, is smaller than 1 mm. Depending on the stiffness of the flexible sheet, the gap distance will be of influence to the accuracy or reproducibility of forming the contact using the second contact process. When the distance is smaller than 1 mm a significant improvement of accuracy during crossing of the gap is achieved.

In an embodiment the flexible sheet has a first lateral thermal expansion coefficient, and the first element has a second thermal expansion coefficient, the difference between the first and second thermal expansion coefficients being less than 5%. The smaller the difference between thermal expansion coefficients, the better the reproducibility of contact formation will be, since temperature fluctuations in time will have less influence. Hence expensive and complicated temperature regulation may be avoided.

In an embodiment the sequence of steps c to f is repeated at least once. If improvement of the lateral alignment after a first sequence of steps according to the method does not give the entire expected or desired improvement based on the determined mismatch and adjustment of relative position, a second cycle of steps within the method may be used to further compensate or correct the mismatch. The method provides an iterative procedure for reducing the lateral mismatch which is advantageous in situations where very accurate alignment is required such as in alignment on the tens of nanometer scale or below. Also it may solve alignment errors introduced by using a less accurate contact method for spanning the gap between anchor surface and first element surface in a first contacting process In an embodiment, in all stages preceding the third stage, the sheet surface is only in contact with the anchor surface. In this embodiment, lateral mismatch is determined between the sheet surface and the anchor surface when in contact during the first stage. Using a priori information of the lateral dimension and position values of features of the sheet surface and the first contact surface that need to be aligned, as well as an a priori known, to these values adjusted, relative position, the determined mismatch can be used to correct for a possible misalignment without establishing contact between the sheet surface and the first contact surface. This is advantageous since there is no need to contact with the first contact surface and associated time and cost, as well as technical difficulties and/or problems such as contamination of the sheet surface and/or the first contacting surface of performing such steps are prevented.

In an embodiment, in the first stage, the first part of the sheet surface is in contact with at least the first contact surface and the lateral misalignment is determined between the sheet surface and the first contact surface. In this case the misalignment is determined between the first contact surface and the part of the sheet that has crossed the gap with respect of the anchor surface. Hence, inaccuracies caused by crossing or spanning of the gap by the sheet surface during the second contacting process are actually determined within this embodiment, therewith improving precision of the method.

In a preferred embodiment the lateral misalignment of the sheet surface and any one of the anchor surface and/or the first contact surface is determined from a plurality of positions spaced apart in the lateral directions of the sheet surface. The determination of mismatch on multiple positions increases accuracy of the determination. In addition, it provides the possibility of measuring in different directions and/or lateral rotation of surfaces in contact or those that are to be brought in contact.

In a preferred embodiment the lateral misalignment is determined at a part of the sheet surface that is in contact with the anchor surface or the first contact surface. It is the parts of surfaces that are in contact that have a substantially stable relative position towards each other in time under external influences. Therewith, the conditions for determination of lateral misalignment are improved leading to relatively accurate and reproducible misalignment values.

In a variation of the previous embodiment the lateral misalignment is determined from detection of an optical intensity pattern formed by a first alignment marker present within the flexible sheet and a second alignment marker present within at least one of the first element and the anchor, the second alignment marker at least partly overlapping laterally with the first alignment marker. Detection of misalignment using alignment markers with which optical intensity patterns such as due to diffraction at gratings is relatively simple and easy to perform as well as accurate. Since, the parts between which the misalignment is determined are in contact, the mutual distance between the features of the partially overlapping alignment markers is fixed. Therewith, the determination of mutual lateral misalignment of the alignment markers from grating or diffraction is free from disturbance by non constant distance between the overlapping alignment markers and is thus relatively precise. Moiré pattern detection from partially overlapping gratings as alignment markers may be advantageously used to determine the misalignment from.

In an embodiment the first element is part of a holder the method comprising the further step of:

providing a second element having a further contact surface, the second element being held by the first element and having a second lateral relative position with respect to the first element; and in which method the first relative position is adjusted taking into account the second lateral relative position and the third stage is established such that the first contact surface is at least partly in contact with the further contact surface. In this embodiment, the lateral alignment procedure is performed between the sheet surface and a first contact surface that is part of a holder, while the actual contact needs to be established between the sheet surface and a second element such as a substrate having a further contact surface. The second element and holder are accurately aligned using appropriate mechanical measures as described, for example, in the description of embodiments. This embodiment has the advantage that the further contact surface, being a substrate surface, does not get contaminated during the alignment procedure. Furthermore, in case multiple second elements are to be successively treated using the method, alignment may be performed be one test run performed every so much treated second elements. If the second elements and their placing within the holder is reproducible to within the misalignment threshold, the determined alignment is preserved after the test determination. Throughput obtained with the method is increased.

In a preferred variation of the previous embodiment, the method comprises the further step of:

determining the second relative position before adjusting the first relative position.

In this embodiment, possible differences in lateral alignment introduced upon inserting successive second elements into the holder are actually determined and taken into account for improving the desired lateral alignment.

In a variation of the previous embodiment, the second relative position is determined from a part of the second element that is not part of the further contact surface. This embodiment specifies that the determination of the relative misalignment between the second element and holder to be performed on a position that is not on the surface of the further contact surface of the second element. The advantage is that this determination now does not require measurement on a difficult to reach position. Thus if optical determination is used a (partly) transparent second element is not necessary and in that case the number of types of second elements that can be used is increased.

In an embodiment, the method of any of the previous embodiments is advantageously used for transferring a template pattern from the flexible sheet to a first element, or if appropriate a second element, the first and second element being, for example, a substrate. The method allows accurate transfer of template patterns having features to substrates such that the features are laterally aligned with specific features of previously provided layers of the substrate. Such transfer is used during manufacturing of material layers of all sorts of (optical) (electronic) devices. The improved lateral alignment of features within the devices allows the manufacture of novel devices with improved tolerances in their feature alignment. The method may provide mask layers for etching in lithography, for example.

In a variation according to the previous embodiment the template pattern is a relief pattern that is transferred using an embossing, imprinting or micro-contact printing process.

In these processes the flexible sheet operates as a physical stamp making contact with the substrate to which the template pattern needs to be provided and the flexible sheet surfaces comprises the relief features that are vulnerable to deformation. Hence such deformation is prevented using the method according to the invention.

The invention further provides a method for the manufacture of a device comprising a plurality of layers, wherein at least two of the plurality of layers are mutually laterally aligned, the method for manufacturing using any of the methods for contacting a sheet surface according to the previous embodiments in order to bring about the alignment. In this embodiment the flexible sheet may be transferred as a whole to the substrate in order to become part of the device to be manufactured as in a lamination or wafer bonding process. Alternatively, the flexible sheet may be used to provide mask patterns to a layer of a substrate as in a micro-contact printing or embossing technique such that the masked layer may subsequently be etched according to the pattern provided as in well known semiconductor manufacturing processes.

In an embodiment, the method of any of the previous embodiments is used for the manufacture of a device comprising a plurality of layers, wherein at least two of the plurality of layers are mutually laterally aligned. The method is significantly easier to use than photolithographic techniques commonly used within semiconductor industry. Consequently, the resulting device will be cheaper. Furthermore, for example patterning with embossing may give better quality pattern features and hence improved devices in terms of functioning, reliability overhead production.

In a second aspect the invention provides a system adapted for carrying out the method according to any of the preceding claims, the system comprising a manipulator for manipulating the flexible sheet to perform at least the second contact process, a holder for holding the first element, or the second element if the first element is part of the holder, the manipulator and the holder being affixed to a mechanical construction to position them with respect to each other; characterized in that the system also comprises:

the anchor, of which the relative position with respect to the holder is adjustable through adjustment means;

measurement means for determining the first lateral misalignment.

By providing the system with an anchor according to the invention and the measurement means for determining the first lateral misalignment, the apparatus is capable of executing the method according to the invention in order to provide a substrate with multiple layers that have a desired overlay alignment. Hence, a cheap and relatively simple apparatus is provided for manufacture of complicated devices in a relatively cheap, efficient and accurate or reproducible way.

In an embodiment the anchor and the flexible sheet are removable from the system. The first contact process may now be performed outside the system and the ensemble of the flexible sheet atttached to the anchor may be inserted into the system before operation.

In an embodiment the first element is part of the holder. This system benefits from the advantageous that second elements such as substrates do not get contaminated by the alignment process used as previously described.

In a preferred embodiment the first element is part of the holder and the holder comprises means for determining the second relative position. This system, allows the determination of the second relative position from the holder side of the second element. Hence, the substrate need not be transparent. In addition, the further contact surface of the second element need not be accessed for alignment determinations at all. The means may be a transparent window, for example.

An a further aspect the invention provides a computer program product for enabling the system to carry out the method according to any of the previous embodiments. Automation of the system during processing of multiple first, or second elements if appropriate, possibly in combination with automated determination of alignments as well as adjustments to correct for alignments is preferred and advantageous from a cost and throughput viewpoint.

In WO03/099463 A2 is disclosed a method for transferring a pattern from a stamping surface of a stamp to a receiving surface of a substrate. The pattern is transferred to the receiving surface by successively bringing portions of the pattern within such a range of the receiving surface that the pattern is locally transferred from the stamping surface to the receiving surface. By applying the method using the apparatus, the transfer of the pattern can be performed according to a wave moving, for example, from the side of a receiving surface to an opposite side of the receiving surface. No alignment procedure is described in this document.

US 2004/0011231 A1 discloses a printing apparatus and a method of printing in which a flexible stamp transfers an "inked" pattern to a receiving surface by mechanical contact. More particularly, the invention relates to a precise and controlled way of bringing two surfaces into contact, and subsequently separating them. The flexible sheet and the substrate can be laterally repositioned with respect to each other when not in contact. No alignment adjustment method is described.

BRIEF DESCRIPTION OF THE DRAWINGS

These and other aspects of the invention will be elucidated with reference to the figures in which:

FIGS. 2A to 2D shows cross sectional views of an apparatus and different stages of a method for embossing stacked layers with overlay according to prior art;

FIGS. 3A to 3D show cross sectional views of an apparatus and method of establishing further contact;

FIG. 4A to 4E show cross sectional views of an apparatus and multiple stages of a method according to the invention using template stamp to substrate surface alignment;

FIGS. 5A and B show cross sectional views of an apparatus and multiple stages of a method according to the invention using substrate to second holder alignment;

FIGS. 6A and 6B shows cross sectional views of an apparatus and multiple stages of a method according to the invention using template stamp to second holder alignment;

FIGS. 10A to 10D and 11A to 11C, respectively show two alternative embodiments of the method and apparatus according to the invention.

In the figures, drawings are not to scale, are purely diagrammatical and like parts have like numerals.

DETAILED DESCRIPTION OF EMBODIMENTS

The invention will be elucidated with respect to an imprint or embossing method and apparatus, which can be used in a process for fabrication of for example (opto)electronic micro- or nano-devices on large scale. Such devices include for example semiconductor devices in microchips. Also large area optical structures can be subject of fabrication.

Figure 1A:
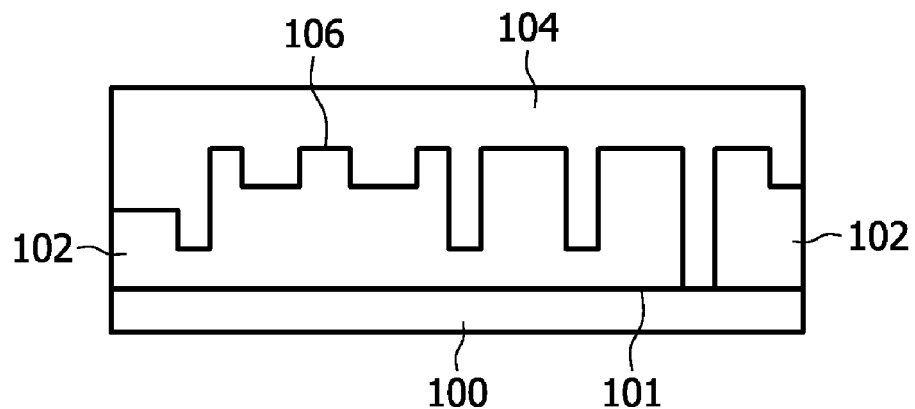
FIGS. 1A and 1B show cross sectional views of an embossing process.
Figure 1B:
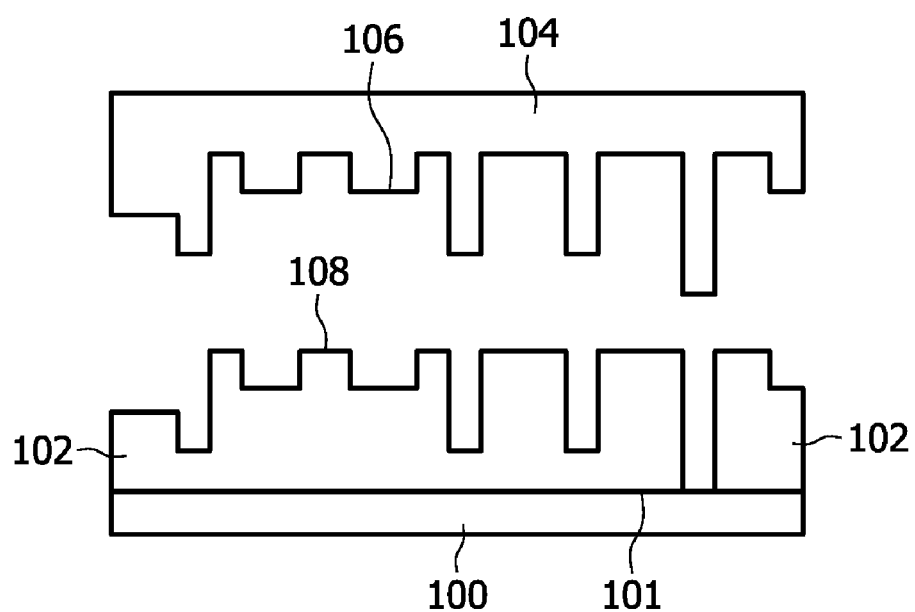

An exemplary and typical process known in the prior art for fabrication of microdevices comprises successive application of device layers to a substrate. A typical process cycle for applying such a device layer comprises deposition of a layer of desired material, for example, an insulator or (semi)conductor, followed by structuring, or so called patterning of the applied layer. In the present example process, the structuring of the material layer is done using imprinting or embossing method. This process includes that during a cycle of steps, to a surface 101 of a substrate 100 a material layer 102 is applied for example in droplets using inkjet printing, or uniformly dispersed using spincoating or doctor blade over the substrate surface 101. The applied material layer is formable. This material layer 102 is brought into contact with a template stamp 104 having a relief surface 106 representing a template pattern 106' that needs to be replicated or imaged into the material layer 102 (FIG. 1A). During the time in which the template stamp 104 is in contact with the material layer 102, the latter material layer first adopts the shape of the relief surface 106 of the template pattern 106' and then is hardened beyond formability using some curing process. Exemplifying curing processes use chemical reactions to solidify the layers under application of heat or radiation, or by solvent removal from the layer as described in the non-pre-published European patent applications 06123325.0 (attorneys docket nr PH007324 EP1) and 06125296.1 (attorneys docket nr PH005814 EP1) as well as in references cited therein. After removal of the template stamp 104 form the material layer 102, a formed relief material layer remains that has the relief surface 108 representing the complementary pattern 108' of the template pattern 106' (FIG. 1B). This formed material layer may serve as a mask for patterning a substrate layer using some etching process, or it may serve as a patterned device layer directly with or without further modification or processing.

In general in devices having multiple stacked device layers, the pattern of one device layer needs to be laterally aligned with that of one or more other such layers. Hence, during application of a new device layer an alignment step is also performed. In the exemplary process as described here above, this means that the alignment step must be performed before the template stamp 104 is brought into contact with the material layer 102, since when they are in contact lateral repositioning of the substrate 100 and template stamp 104 is difficult or impossible. Lateral positional shifting of the template stamp with respect to the substrate when in contact with the formable layer requires relatively high forces when compared to the mechanical properties of the template stamp features. Hence these features are likely to become deformed and even destroyed during such shifting. Therefore, positional shifting can only take place before contacting or by releasing of the stamp from the substrate. It appears however, that the process for (re)establishing the contact between the template stamp and the material layer 102 of the substrate 100 is generally inaccurate and/or irreproducible. Therewith alignment of patterns of different device layers is hampered using imprint patterning techniques of any sort.

The alignment mismatch is elucidated with reference to FIGS. 2A to 2D, schematically showing different stages of application and patterning of two identical device layers for which overlay alignment is required on top of each other, the process being performed according to an exemplary procedure using a known apparatus as described in WO/099463 A2. The improvement offered by the invention will afterwards be elucidated by describing the implementation of the invention to the known method and apparatus. It is noted however, that as those skilled in the art will appreciate, the problem is not limited to this apparatus but equally applies to other imprint apparatuses and the associated methods as disclosed in, for example, U.S. Pat. No. 5,669,303 or US 2004/0197712 A1. Implementation to these other known apparatuses and methods will also be described.

The apparatus 210 in the FIGS. 2A to 2D according to WO/099463 A2 comprises a first holder 212 having a plurality of spaced apart nozzles 214. In each nozzle 214 a gas (for example air or inert nitrogen) pressure can be varied individually between an under-pressure V and an overpressure P with respect to atmospheric pressure. To this end the apparatus 210 further comprises gas handling equipment according to known art, which for reasons of clarity is not shown.

A template stamp (also referred to as the first element) 204 is held by the first holder 212 by providing an under-pressure V to the nozzles 214. The template stamp has a stamp surface (also referred to as the first element surface) 216, which is exposed. Although not shown for clarity, the stamp surface comprises a relief pattern 206 similar to the relief pattern 106 of the template stamp 104 described with reference to FIG. 1.

At a distance from the first holder 212 is positioned a second holder 218, which in this case holds a substrate (also referred to as a second element) 220 using for example the same pneumatic principle as with which the first holder holds the template stamp. These means are, however, not shown as they are not essential to the invention and many alternatives including electromagnetic attachment, or mechanical clamping may be used as known to those skilled in the art. The substrate 220 includes a formable material layer 222 having a surface 224 (also referred to as the second element surface) which is exposed and faces the also exposed template stamp surface 216. The material layer 222 is not separately shown.

Both the first and second holders are attached to mechanical stages that are part of a mechanical construction, the stages allowing that the holders 212 and 218 and therewith the stamp surface 216 and the substrate surface 224 are positioned and oriented with respect to each other through rotation and/or displacement along the X, Y and Z axis of a Cartesian coordinate system coordinates. In the present example the second holder 218 is movable with respect to the static first holder 212. The mechanical stages and construction are not shown for clarity and because those skilled in the art will known how to construct them according to known art.

In the second stage represented by FIG. 2B, the template stamp surface 216 has been locally brought in contact with the substrate surface 224 through displacing a first part of the template stamp 204 in the Z-direction by pressurizing a number of the nozzles 214. Note that nozzles having an under-pressure prevailing within them are denoted by a letter V, while those wherein an overpressure prevails are denoted with the letter P. The known method now involves that the nozzles 214' are sequentially pressurized starting from the left most one such that the contact area between the template stamp 204 and the substrate surface 224 is gradually increased to some desired value (not shown in FIG. 2, but compare FIGS. 3A and 3B). In this process to which hereafter will be referred to with 'the establishment of further contact', the waved template stamp part 204', spanning the gap between the first holder 212 and the substrate material layer 222, advances to the right in a steady manner with a controllable advancement rate (not shown). Once the desired contact area is established, the material layer is cured for example according to a process as described with reference to FIG. 1. The resulting relief surface (not shown) thereafter comprises a relief pattern (not shown) wherein, in this example, at the X-position 226 an alignment marker X1, present in the template stamp, is replicated.

Figure 2C:
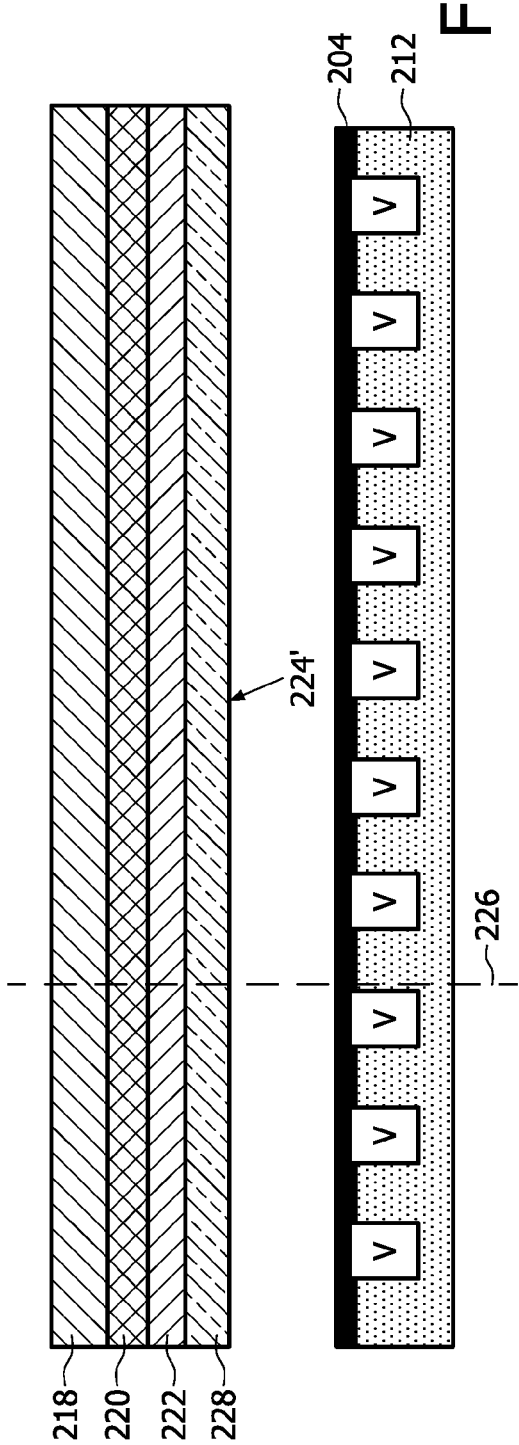

Subsequently, the entire template stamp 204 is released, or removed from the hardened substrate surface 224 and a further material layer 228 having a surface 224' exposed is applied on top of the hardened patterned material layer 222 to obtain the third stage (FIG. 2C). The application of the layer 228 can be done using conventional material deposition techniques such as spincoating or (ink)jet printing.

Figure 2D:
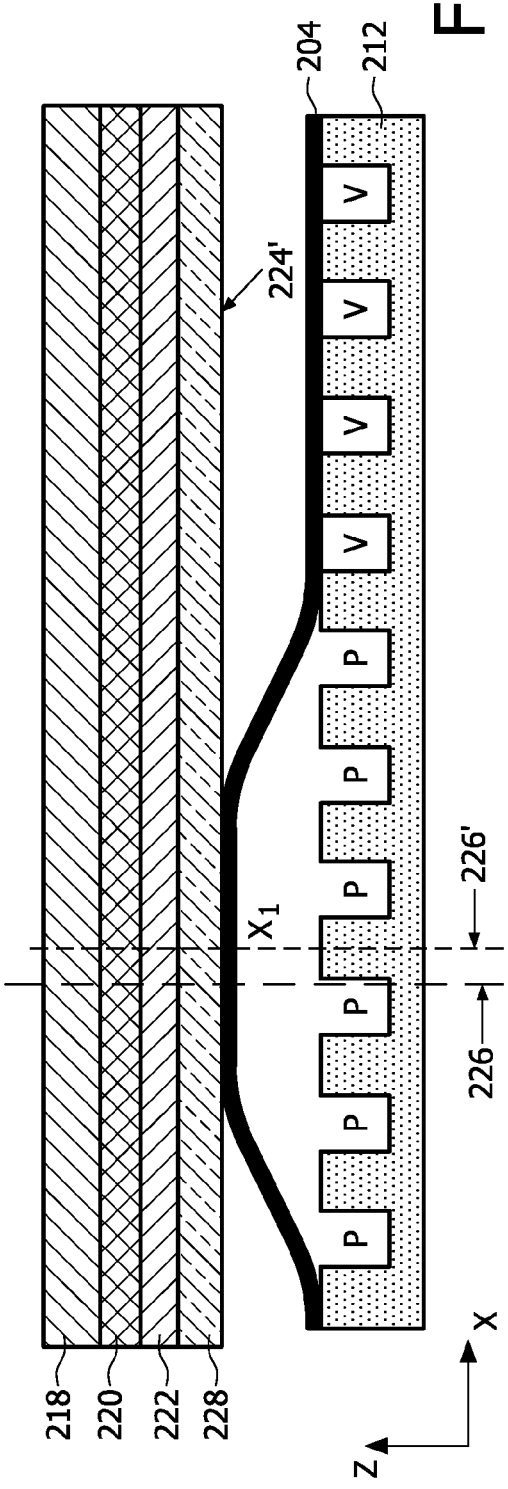

In the fourth stage of FIG. 2D, the template stamp 204 is aligned laterally such that the alignment marker X1 is positioned opposite of the replicated alignment marker (not shown) within the substrate surface 224 in order that it will again be replicated at X-position 226 now in the new substrate surface 224' using the process described above for the second stage. However, the process for establishing the contact using nozzle pressurization is precise to a finite scale and beyond that scale introduces a misalignment such that the second alignment marker is replicated at X-position 226'. The misalignment hampers device construction when it is larger than a tolerable threshold misalignment. This will be increasingly the case when feature sizes shrink below the micrometer size and especially below the tens of nanometer size, a scale where semiconductor as well as optically oriented industry is going today.

It has been found that such misalignments are generally of the micrometer scale with a process and method according to the present exemplified principle, or with other processes as disclosed in the prior art referred to here before. It is especially difficult to establish contact with nanometer overlay precision, which is not an uncommon precision required for patterns having features below micrometer scale such as often present in nowadays' (opto)electronic micro- and nanodevices. It is therefore needed to have a method and apparatus that allow that the misalignment is reduced beyond a tolerable threshold misalignment.

It has however also been found that the method of establishing further contact as described using the apparatus as described here above is more accurate and/or reproducible than the initial contacting process described here above. The reproducibility and accuracy is schematically shown with the process of in FIGS. 3A to 3D. Numbers shown but not explicitly described represent the corresponding parts as described in FIG. 2A to 2D. After establishing the initial contact in the stage of FIG. 3A, the template stamp waved part 304' is advanced by sequentially pressurizing the nozzles 314' to finally reach the stage of FIG. 3B. After curing to harden the layer 322 the alignment marker X1 is replicated at the X-position 326. Subsequently, the template stamp waved part 304' is retreated to the stage of FIG. 3C by depressurizing the nozzles 314' in the reverse sequence. Thus, the sheet is not released from the substrate. Then, the waved part of the template stamp is advanced again to the stage of FIG. 3D. It is then found that the alignment marker X1 is at the position 226 again with a misalignment that is significantly less than that obtained by the process of establishing initial contact as described with reference to FIGS. 2A to 2D.

Using, for example, a method and apparatus, as detailed within the non-prepublished European patent application 06125296.1 (attorneys docket nr PH005814 EP1) overlay, or lateral misalignment as measured form moiré patterns formed by overlapping line gratings, is reduced to below one nanometer. The gratings had a pitch of 580 nm. The patterns were measured using a light emitting diode light source giving 410 nm light and a CCD detection camera measuring light reflected from the overlapping alignment markers under an angle of 45 degrees from the plane normal. The sheet was attached to a dry substrate, further contact was established over a distance of 5 cm and the moiré pattern was measured. The contact was broken by reversing the further contacting process 5 cm leaving the sheet for approximately 30 seconds in that state before recontacting the sheet using the same process for establishing further contact. The moiré pattern was established again. Comparing both patterns it was found that the overlay alignment of the gratings differed not more that approximately 0.5 to 1 nm. Similar experiments and results are obtained using a sol-gel replication process.

The process of establishing further contact and especially the increased accuracy and/or reproducibility with respect to the process for establishing initial contact is used to advantage in the present invention. To this end in a first embodiment an apparatus 410 as described with reference to FIG. 4A to 4E is provided to perform the method according to the invention. The apparatus 410 comprises a first holder 412 and a second holder 418, both designed and operated substantially identically to the corresponding parts of the apparatus described with reference to FIGS. 2 and 3.

The first holder 412 is provided with a template stamp 404 which includes a stamping surface 416 and the second holder 418 is provided with a substrate 420 having an exposed surface 424 which extends at a distance 425 from the template stamp surface 416. In the present embodiment, the surfaces 424 and 416 are substantially flat and extend substantially parallel to each other.

The formable material layer of the substrate 420, which layer is to be embossed with the template stamp pattern as in a process described with reference to FIG. 1, is not shown for clarity.

The apparatus 410 further comprises an anchor 430 having an anchor surface 432 that extends at a second distance 425' from the template stamp surface 416. The anchor 430 is positioned next to the second holder 418 forming a gap 433 between them. The gap has a width 431. The relative position of the second holder 418 and therewith the substrate 420 and its surface 424 is adjustable with respect to the that of the anchor 430 and its surface 432 through the apparatus comprising mechanical constructions and electromechanical means for moving these constructions as known in the art.

Using the adjusting means the substrate surface 424 and the anchor surface 432 are oriented such that they extend in the same virtual plane at substantially the same distance from the template stamp surface 416.

In a first optional step of a method according to the invention, the template stamp surface 416 and the substrate surface 424 are laterally aligned, for example in the X-direction, in a coarse way when they are not in contact The coarse alignment in this embodiment is performed by aligning a first alignment marker 435 present on the template stamp surface 416 with a second alignment marker 434 present on the substrate surface 424 using an optical alignment system. To this end, the first holder 412 and the template stamp 404 are partly optically transparent for allowing the alignment determination.

Subsequently, an initial contact between a part 436 of the template stamp surface 416 and the anchor surface 432 is established by changing a gas pressure within the relevant nozzles 414 from an under-pressure denoted by the letter V to an overpressure denoted by the letter P as shown in FIG. 4B. This initial contact effectively immobilizes the template stamp 404 laterally with respect to the anchor 430. The anchor 430 therewith serves as a fixed lateral reference position of the template stamp 404.

In a following step a further contact is established between a further part 438 of the template stamp surface 416 and the substrate surface 424 by using a process for creating a gradual contact as described with reference to FIG. 3. Thus, by sequentially pressurizing subsequent neighboring nozzles 414', the part 404' of the template stamp 404 is allowed to advance, in the present embodiment along the X-direction, such that the surface of this part 404' gradually and increasingly makes contact with first the anchor surface 423 such that the initial contact area 436 is increased, and secondly with the substrate surface 424 after spanning the gap 433, to form a further contact area 438. In the present embodiment the contact area does not comprise the entire template stamp surface 416. This is advantageous in case of lateral misalignment between the surfaces 416 and 424.

In the further contact area 438 no embossing material layer that is part of the substrate 420 is present in view of sticking and/or contamination of the first and second alignment markers 435 and 434. Alternatively, such material is present in this area.

In the present stage of the embodiment depicted in FIG. 4B the first and second alignment markers 435 and 434 do not overlap or align completely, indicating a lateral misalignment of the substrate surface 424 and the template stamp surface 416.

To remove this misalignment, the method according to the invention first provides for determination of the misalignment using the alignment markers 435 and 434 and an optical alignment measurement system. In the present embodiment, the first and second alignment markers comprise gratings invoking a moiré pattern due to their overlap when illuminated with a light source and observed using an optical system. From these patterns the misalignment is determined and quantified, according to formalisms know in the art, in terms of grating overlap mismatch distances in the lateral directions, i.e. in the X and/or Y directions in the present embodiment.

If the determined quantified misalignment exceeds a threshold misalignment, i.e. the mismatch in the lateral position of the first and second alignment markers is larger than a predetermined allowed mismatch, then the further contact within contact area 438 is undone by disconnecting or releasing the template stamp surface 416 form the substrate surface 424. The initial contact of the template stamp surface 416 to the anchor surface 432 wihtin an area 436 is however preserved at all times. Undoing the further contact, in this embodiment, is performed using a process that is the reverse of that used for establishment of the further contact. A similar further contact process reversal is detailed with reference to FIG. 3.

Figure 4C:
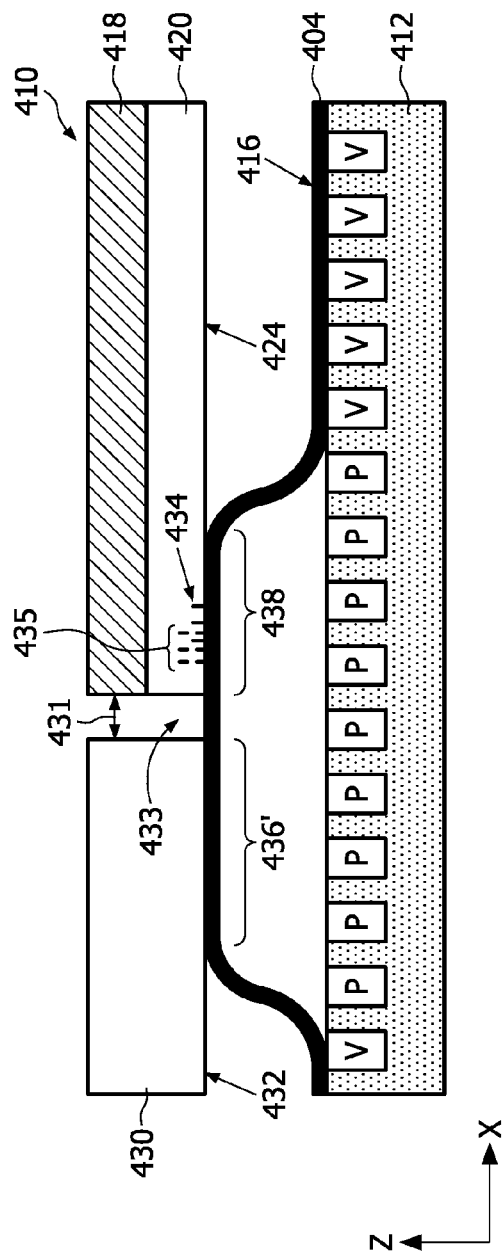
Figure 4D:
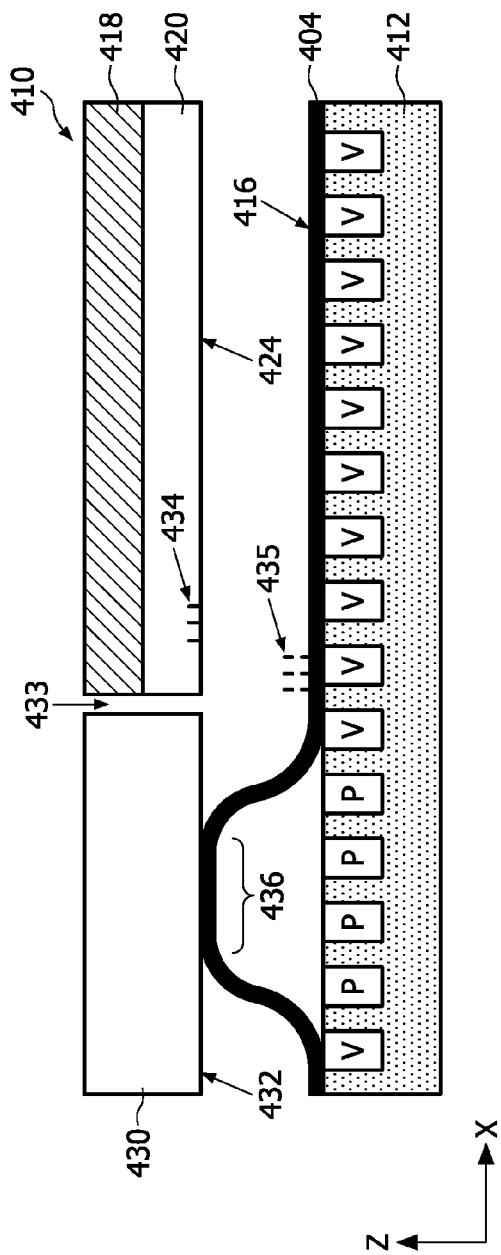

While residing in the resulting stage of FIG. 4D, which largely resembles that of FIG. 4B, the relative position of the substrate surface 424 is altered by displacing the second holder 418 with respect to the anchor 430 to an extent such that the determined misalignment is corrected for to a value such that it is at least smaller than the threshold misalignment. In the present embodiment the second holder is displaced in the negative X direction to the extent found by the quantified determined misalignment. Note that in this case the gap 433 is reduced in this case.

Figure 4E:
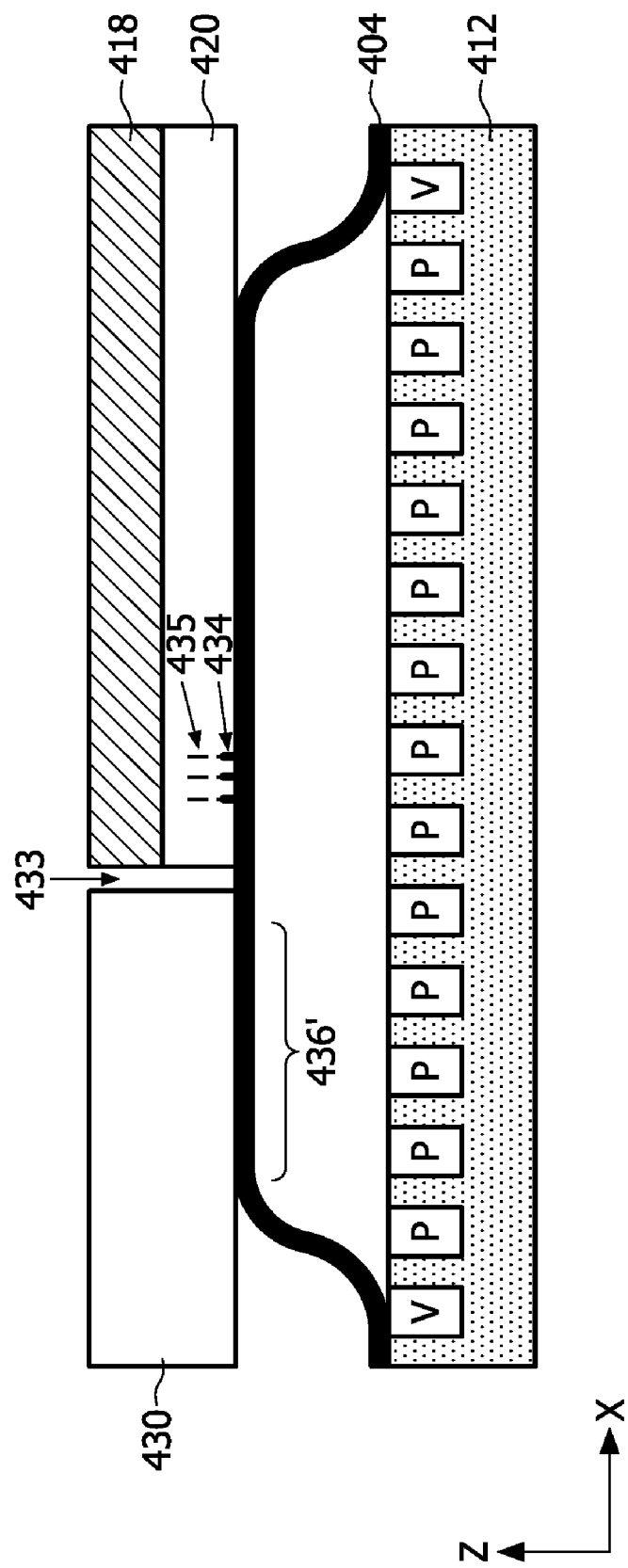

After adjustment, in a next step of the method, the further contact of the template stamp surface 416 and the substrate surface 424 is finally established in its entirety using the process for establishment of further contact that is also used when establishing the further contact for the first time. The result is shown in FIG. 4E. The improved accuracy and/or reproducibility of the process for establishment of further contact over that of establishing the initial contact ensures that contact between the template stamp surface 416 and the substrate surface 424 over the entire substrate area 438 that needed to be contacted is now achieved with alignment comparable to that described for the process described with reference to FIG. 3. Therewith, the apparatus and method according to the invention enable the preparation of multiple layered devices having improved overlay alignment of their device layers.

In a second embodiment, being a variation and an extension of the first embodiment, after having performed the first correction of misalignment, the further contact is established another time only over a contact area 438 just large enough such that the area comprises the alignment markers 434 and 435. This leads to a stage similar to that depicted in FIG. 4C, with this difference that the alignment of the alignment markers is may be different.

Subsequently, the misalignment is determined again and, when still exceeding the threshold, misalignment is corrected for again using the same sequence of steps as described for the first correction cycle including releasing the further part 438 from the substrate surface 242, but not from the anchor surface 432, adjusting the relative position and reestablishing the further contact for the further part 438. If necessary to achieve satisfactory lateral alignment, this sequence of steps is repeated until the misalignment has been reduced to below the threshold misalignment. Once this has been achieved the further contact is established in its entirety resulting in a situation as depicted in FIG. 4E.

This iterative correction of the second embodiment is advantageous in that very precise lateral alignment such as on the nanometer scale or less, can be achieved.

A third preferred embodiment, is described with reference to FIG. 5. In this embodiment the alignment of the substrate surface 524 and the template stamp surface 516 is performed in the same way as described for the first embodiment, with this difference that a further set of alignment markers is used in the method to laterally align the substrate 520 with the second holder 518. The method and apparatus are advantageous when multiple substrates need to be handled in succession with increased throughput and accuracy, but with a reduced number of steps for establishment of further contact.

The further set of alignment markers comprises a second substrate alignment marker 542 that is part of a substrate 520 and a first holder alignment marker 544 which is part of the second holder 518. Preferably, as in the present embodiment, but not necessarily, these alignment markers are located close to each other the marker 542 on the back-surface 546 of the substrate 520 and the marker 544 on a first holder surface 548.

The method is largely identical to that of the first embodiment. Thus, a substrate 520 is provided to the holder 518. Different from the first embodiment, after having provided the first substrate, a lateral substrate misalignment is determined between the substrate 520 and the second holder 518. In the present embodiment, this is done using the same optical measurement system and method as used for the template stamp misalignment described here above, albeit that different alignment markers are used. This saves the need for a further optical system. Thus, the alignment markers comprise gratings from which, through moiré pattern formation observed with the optical measurement system, the lateral (X and/or Y direction in the present embodiment) positional mismatch is determined, quantified and stored. If this has been done, the method proceeds according to the method described in the first embodiment. Thus, initial contact is established, misalignment is determined between template stamp surface 516 and substrate surface 524 using the alignment markers 534 and 535 and a possible misalignment exceeding the threshold is corrected for by using the method for establishment and release of further contact as described in the first embodiment. The result for the first substrate after establishment of the final contact with correct alignment is exemplified by the situation as shown in FIG. 5A.

In a practical (factory) device manufacturing process, the first substrate is removed from the second holder 518 when all necessary steps to be performed within the apparatus 510 have been performed. Then a next substrate 520' is introduced to the second holder 518. This substrate 520' generally will have a slightly different lateral alignment than for example the previous substrate 520. In order to deal with this variation in a convenient way, the lateral substrate misalignment is determined and quantified again. The appropriate values are compared to those determined for the previous substrate 520 (or any other reference substrate) and if the comparison reveals a difference that exceeds an allowable threshold misalignment, then the relative position of the second holder is altered accordingly to correct for the difference such that the alignment of the template stamp surface 516 with the substrate surface 524' is substantially unaltered with respect to the alignment of the corresponding surfaces when the substrate 520 (or any other reference substrate) was present in the apparatus. An exemplary result after the entire contacting process for the next substrate is shown in FIG. 5B. Note that in comparison to the situation of FIG. 5A in that of FIG. 5B the third and fourth alignment marker lateral mismatch is corrected for by the shift in X position of the second holder 518 with respect to the anchor 530 giving a smaller distance 531' between anchor 530 and second holder 518, but substantially the same distance 531 between substrate 520' and anchor 530, as required for similar substrate to template stamp alignment.

In a test run of the method the alignments can be calibrated using a test substrate. The calibration may be repeated according to desire in order to maintain a certain level of reproducibility or accuracy of reproducibility if parameters vary in time, for example through temperature fluctuations. Those skilled in the art will known how to monitor such processing conditions relevant to alignment parameters.

A fourth embodiment described with reference to FIG. 6 is advantageous in that it does not require contacting of the template stamp surface to the substrate for measuring the misalignment. This saves time and keeps the substrate and stamp surfaces clean. To this end, the apparatus 610, being largely identical to that of any one of the previous embodiments, comprises a holder surface 650 that is exposed and faces the template stamp surface 616. This holder surface 650 comprises a second holder alignment marker 652. A first variation of this embodiment is shown in FIG. 6A. The method substantially resembles that of the first embodiment or the second embodiment with the difference that lateral misalignment is now determined and corrected between the template stamp surface 616 and the second holder surface 650 in stead of the substrate surface 620. Those skilled in the art will know that before using the method of this embodiment a calibration needs to be performed since the relative lateral position of the substrate surface and the second holder will be initially unknown. Such a calibration may be performed as described here above. Furthermore, the present variation requires that substrates can be replaced reproducibly in order to allow reproducible contacting with lateral alignment. This can be for example achieved by placing the edge 660 of a substrate 620 to the edge 662 of the second holder, the substrates 620 being identical of course.

In another variation of the present embodiment, use is made of the further set of alignment markers to measure misalignment (alignment) between substrate 620 and second holder 618 for every substrate to be processed in the apparatus, as described in the third embodiment (FIG. 6B). In this way alignment per substrate is checked, which is more precise in terms of accuracy and/or reproducibility than when the edge alignment of the previous variation of the embodiment is used. Also in the present variation calibration is preferably performed.

The method and apparatus of the invention have been described here above with respect to one dimensional sectional view and alignment, i.e. lateral alignment in the X-direction. It will be clear that all principles are equally applicable to lateral alignment in another direction such as in the present invention in the Y-direction being the second independent lateral dimension (perpendicular to the plane of drawing in the Figures). In general, lateral alignment may or must take place in both of the two independent dimensions, i.e. in the X and Y direction. To this end the alignment markers are designed for this purpose. An example is described with reference to FIG. 7. The example or any other suitable embodiment for achieving the same effect can be used in any of the previously described embodiments as well as other embodiments according to the invention not described in the present application and if appropriate in both substrate to holder alignment as well as substrate to template stamp alignment.

Figure 7:
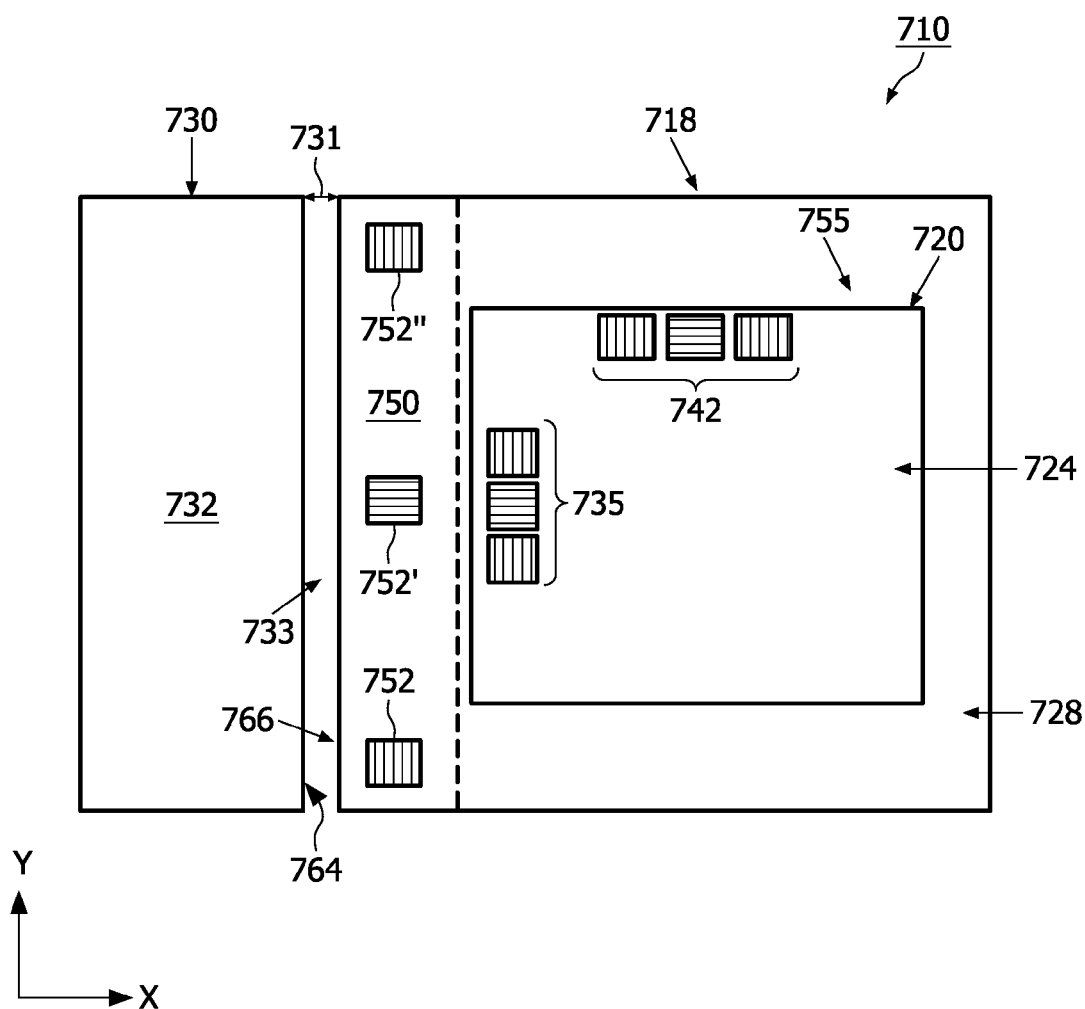
FIG. 7 shows a top view of an apparatus according to FIG. 5 having multiple alignment markers.

In FIG. 7 an apparatus 710 according to the invention is viewed in the direction from the first holder (not shown for clarity) to the second holder 718, along the Z-direction, showing the first holder surface 755. The second holder 718 holds a substrate 720 exposing its surface 724 and covering part of the first holder surface 755. The holder further comprises a second holder surface 750 comprising for example alignment markers 752, 752' and 752". The apparatus comprises further an anchor 730 having an anchor surface 732. The edge 764 of the anchor 730 is located at a distance 731 from the edge 766 of the second holder 718.

The substrate 720 comprises alignment markers 742 for alignment of the substrate 720 with the second holder 718. The complementary alignment markers 744 on the second holder have been omitted for clarity. Furthermore, the substrate 720 comprises alignment markers 735 for alignment of the substrate surface 724 with the template surface if necessary. And so the apparatus of FIG. 7 closely resembles the one described with respect to FIG. 6B. It is thus operated in the same way as described with reference to FIG. 7. During the operation, alignment markers 752 and 752" are used for determination and correction of misalignment in the X direction as a consequence of translational mismatch and/or relative rotation (in the plane of drawing) of the holder surfaces 750 and 755 with respect to the template stamp surface (not shown). The alignment marker 752' can be used for translational mismatch in the Y-direction.

It will be appreciated that the alignment achieved in this way can be checked using the alignment markers 735. These markers could also be used for a calibration of the method for a certain substrate type. Furthermore, it will also be clear that the alignment markers 742 can be used in a similar way as described for the markers 752 to 752" in order to laterally align the substrate 720 with respect to the second holder 718.

In the present application alignment determination is based on optical measurement using grating alignment markers. In general alignment determination and the provision of alignment markers to substrates is routinely done within for example semiconductor industry. It is in first instance not essential to the present invention and that many different alignment techniques may be used without departing from the scope of the invention. In this respect it is mentioned that electrical alignment measurements using for example capacitive coupling of markers may be used to advantage since the parts that comprise these markers are in close proximity during contact when the alignment or misalignment measurements occur at these contact locations. Such a setup would require that a suitable electrical system is used within the method which optionally and preferably is part of a system or apparatus according to the invention.

Optical alignment measurements as described with reference to the above embodiments require that a light path is present for measurement. This is exemplified with reference to FIG. 4. Thus, back side substrate alignment, i.e. at the substrate surface for example 424, but form the back of the substrate, requires that at least a part of the second holder 418 and the substrate 420 is transparent for at least the measurement light. In the above described embodiments this can be realized accordingly by providing the appropriate measurement windows and a (partially) transparent substrate such as for example a glass or quartz substrate. Alternatively, the alignment measurement can be performed from the front side of the substrate surface 424. This requires that the template stamp 404 and first holder 412 are, at least partly, transparent. This is preferred with respect to the previously described variant, since in the latter variant alignment is also possible when non-transparent substrates are used. Those skilled in the art will know how to provide a first holder with optical windows according to known art. The template stamp can be made of for example a thin glass sheet comprising a stamping material such as polydimethoxysiloxane disposed over its surface. Alternatively, the template stamp comprises a laminate of a non-transparent material sheet (for example plastic or metal) having at least one cut-away at the alignment position, the at least one cut-away being covered by a sheet of transparent material.

In case of an apparatus according to the embodiment described with reference to FIG. 6, the optical windows do not need to be present in the substrate or a substrate does not need to be transparent when backside alignment is performed.

It will be clear that for alignment of the substrate to a substrate holder using the further set of alignment markers as described with reference to FIG. 6B similar provisions allowing optical alignment must be provided. This can be done according to known art.

Figure 8:
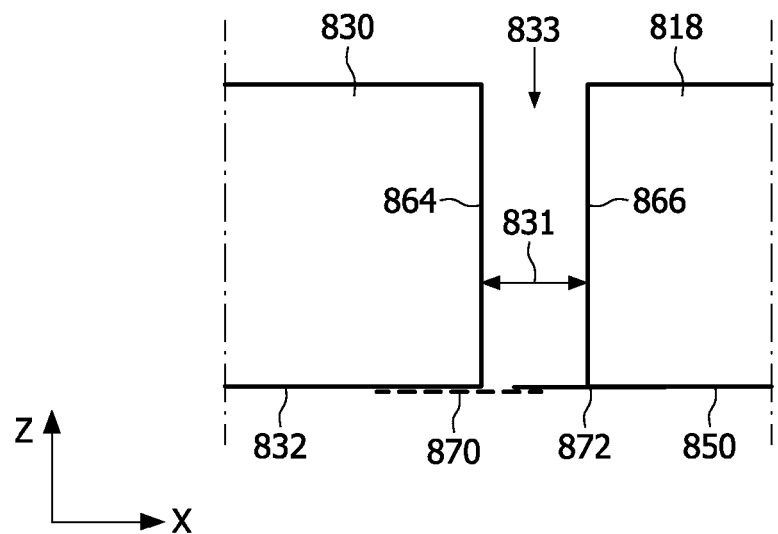
FIG. 8 shows a lateral view of a part of an apparatus according to the invention illustrating anchor to second holder alignment.

In all of the embodiments described the accuracy and/or reproducibility of the process for establishing further contact may be influenced by the template stamp having to span the gap width between anchor and second holder or substrate surface. With reference to FIG. 8, showing a part of an apparatus according to the invention comprising an anchor 830, an anchor surface 832, an anchor edge 864, a second holder 818, a second surface 850 and a second holder edge 866 defining a gap 833 with a width 831, it is clear that the flexibility of the template stamp 804 in combination with the width 831 is of influence to the accuracy and or reproducibility through possible bend through of the template stamp 804.

The accuracy may increase with stiffer template stamp 804 and smaller width 831. Thus with a particular stiffness of template stamp, generally the higher the accuracy and/or reproducibility required, the smaller the width 831 must be. In order to increase the accuracy and reproducibility to a practical value for an embossing process as described, the width 831 is smaller than 5 millimeter. However, it is preferably smaller than 1 millimeter and more preferably smaller than 0.5 or 0.1 millimeter.

It is noted that the width 831 that must be spanned during processing is partly determined by the way the initial contact is made. A lateral shift of initial contact directly determines the width. In an embodiment according to the invention, the template stamp 804 comprises alignment markers in the area 836 when in contact with the anchor surface 832. This provides an initial check for the position of the template stamp to the anchoring surface when starting a new cycle of experiments or after changing a template stamp within an apparatus.

An optional step to reduce the gap during the execution of the method is a preliminary coarse lateral alignment (translational and rotational in the plane of the substrate surface) of the template stamp with the substrate surface. The coarse lateral alignment is also useful in restricting the range necessary for adjustment of the relative position, i.e. for translation of the second holder and/or the anchor and/or the first holder. It is even preferred when very fine alignment such as on the micrometer or nanometer scale is required. Usually, the devices for moving the anchor and/or the first holder and the second holder on very small scale such as piezoelectric driven devices have small translational or rotational range. Therefore, an apparatus according to the invention for the purpose of providing very accurate alignment is preferably provided with an (electro)mechanical system allowing coarse (centimeters to millimeters) lateral alignments which operates independently from an also present second (electro)mechanical system allowing small scale adjustments (smaller than millimeters and down to nanometers or below). While the coarse system may comprise electromotors in combination with micro-spindles or pneumatic means according to the known art, the more precise system may have for example piezoelectric devices or Lorentz actuators as described in the known art.

With respect to the spanning of the gap 833 it is preferred that the tangent plane of the anchor surface at the position of the edge 864 is in the same virtual plane as the tangent plane of the holder surface 850 at the position of the edge 866. This gives the least stress in the template stamp 804 as for example no steps in the Z direction need to be spanned. It will be clear that the apparatus to this end comprises the necessary (electro)mechanical system. Such system can be constructed using known art. It is noted that it is not necessary that the anchor surface and the second holder surface are flat. In most practical situations they are flat since the substrates and the substrate surfaces are preferably flat, with the exception of substrate surface deformation as in, for example, silicon wafers during semiconductor manufacturing processes, which wafers get distorted during heat treatments. In the embodiments described here above the template stamp surface only comprises a relief pattern with small size features and otherwise is substantially flat on larger scale as is the substrate surface.

Figure 9:
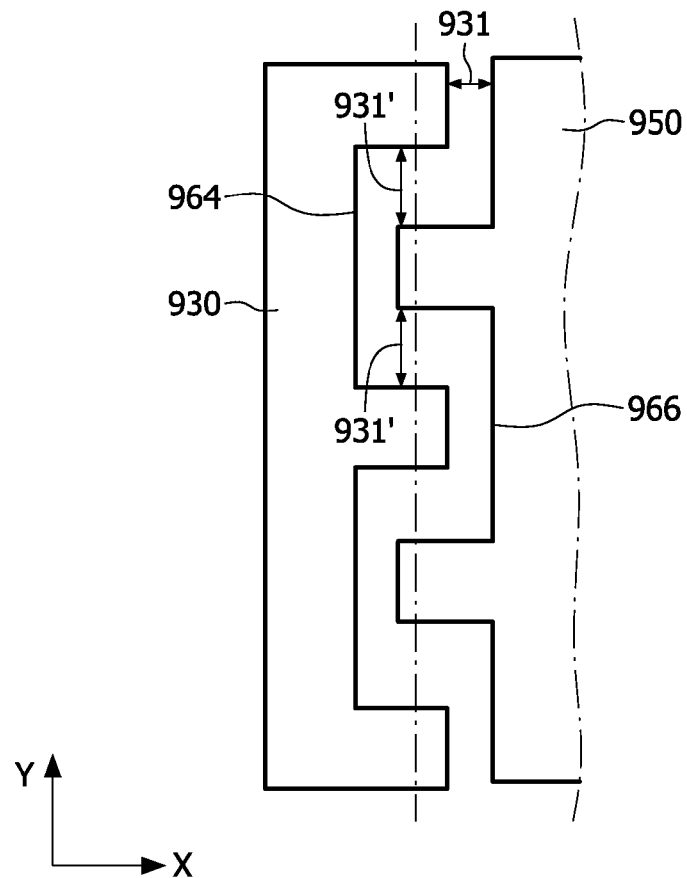
FIG. 9 shows a lateral view of part of an apparatus according to the invention.

To increase the accuracy and/or reproducibility of the establishment of further contact, the edge 964 of an anchor 930 and an edge 966 of a second holder 918 can be specifically given a corrugated shape or having digits such that the anchor surface 932 and the second holder surface 950 are at least partly interdigitated. The shapes may be complementary. An example is shown in FIG. 9. When increasing the width 931 of the gap 933, the gap width in the X direction is not increased at for example the Y regions indicated with the arrows 931'. The interdigitations therewith help to distribute the gap spanning over a larger X region. Note that the adjustment range in the Y direction in this case is given by twice the gap width (also indicated with the arrows 931') in the Y direction. Alternatively, the method comprises that the advancement of a contact front during establishment of a further contact is allowed to proceed not parallel to the direction in which the gap extends in the lateral dimensions. In this way the flexible sheet or stamp crosses the gap in only a few positions at a time. This may be implemented by orienting the gap appropriately with respect to the contact front advancement or, when the apparatus at hand allows it, to steer the advancement of the contact front. This can be for example done using the apparatus described here before.

When lateral alignment is required on small scale (for example smaller than micrometers) and over large area (such as for example square centimeters), an apparatus according to the invention is designed such that the template stamp and substrate have substantially comparable thermal expansion coefficients in the lateral plane. Preferably the thermal expansion coefficients are substantially equal. This can be achieved by using a material for the template tamp that is the same or similar to that of the substrate. Thus for example, when the substrate is made of steel, the template stamp may be constructed of a steel thin sheet also called back-plate (confer also WO 03/099463 for details on the construction of composite flexible sheet/stamp having such a back-plate) having disposed on one of its surface a stamping layer comprising material such as for example polydimethoxysiloxane or other elastic material. The thermal expansion coefficient will then be dominated by that of the steel plate while the stamping or embossing or other properties are determined by the elastic layer. Alternatively a glass back plate may be used when the substrate is also made of glass. An apparatus and method so designed and used thus enables lateral alignment without suffering from mismatch due to temperature variations therewith especially aiding lateral alignment on a very small scale.

In a preferred embodiment, the method according to the invention is automatically performed by an apparatus according to the invention. To this end an apparatus or system according to the invention comprises one or more electrical mechanical systems, and/or one or more electrically operable optical systems all of which are preferably controllable using one or controller units steered by microcomputers. Furthermore, preferably user interfaces and input devices are provided for example for giving in the threshold misalignment values or other parameters of choice. The apparatus further preferably comprises data carrying devices as well as software suitable for controlling the execution of the method of the invention by an apparatus according to the invention.

The software comprises input of parameters used within the method such as the threshold value.

The present invention has been explained in the context of imprint lithography or an embossing process. It is however noted that the invention is equally well applicable in different technological areas such as microcontact printing as known in the art.

In these processes the flexible sheet has been in the form of a template stamp. However, it may also be used for laminating one layer to another without the need for transferring a pattern on either of the layers to the other. An example of such a laminating process is a wafer bonding process. In this case a silicon wafer to be laminated to another silicon wafer is thinned down by polishing or etching, for example, to such a thickness that it is suitably flexible in order to be laminated as the flexible sheet using a method and apparatus according to the invention. The as such contacted and aligned wafers may be treated according to standard wafer bonding conditions. The method of the invention allows that the both wafers comprise small featured devices that become inter connected with accurate and/or reproducible alignment. Hence, the method provides improved and more complex device fabrication in a more simplified way and over large area in one process run or cycle.

Alternatively, the flexible sheet may be of the back-plate type comprising a material layer that needs to be laminated to a substrate. After bringing the contacting surface of the material layer in contact with the substrate and possibly performing an adhering step using an adhesion process (heated curing of an adhesive layer) the material layer is released from the back-plate. The release may be done for example by first adhering the material layer to the back-plate using a so called UV release adhesive and by irradiating this layer with UV radiation to activate this adhesive to release the material form the back-plate. This method is advantageous when the material layer is very flexible or deformable such that it needs a support structure for transferring it to the substrate. Organic foils may benefit from this procedure without losing the advantageous described for the wafer bonding process.

In any case the invention is especially suitable for processes where precise alignment often better than micrometer scale is required.

Furthermore, the invention has been described with respect to an apparatus and method specifically designed for establishing further contact as described in WO 03/099463. The principle used is called 'wave printing'. The invention is however equally applicable in different methods and corresponding apparatuses designed for the same purpose. The embodiments also show that the present invention is advantageously used to improve existing apparatuses and methods for establishing contact between a flexible sheet and a substrate. Two embodiments are described here below.

Figure 10A:
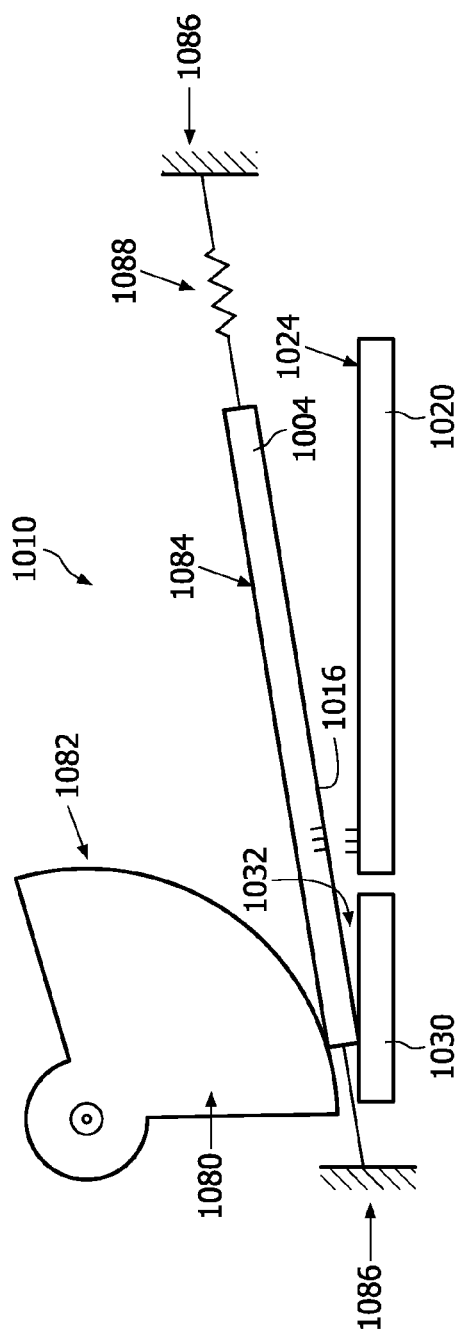

In one embodiment, illustrated with reference to FIG. 10, a rolling member 1080 having a curved surface 1082 is rotated such that its curved surface 1082 is rolled over one side 1084 of a flexible sheet 1004 in order to gradually press the contact side 1016 on the other side of the flexible sheet 1004 to a surface 1024 of a substrate 1020. The method and apparatus 1010 are based on a method and apparatus known from US 2004/0197712 which are modified according to the invention. Thus, an anchor 1030 having an anchor surface 1032 is positioned next to the substrate 1020. The anchor and the substrate are (re)-positionable with respect to each other in an analogous way as elucidated in the previously described embodiments. Further details on mechanical construction of an apparatus according to this embodiment are provided in US 2004/0197712.

Figure 10B:
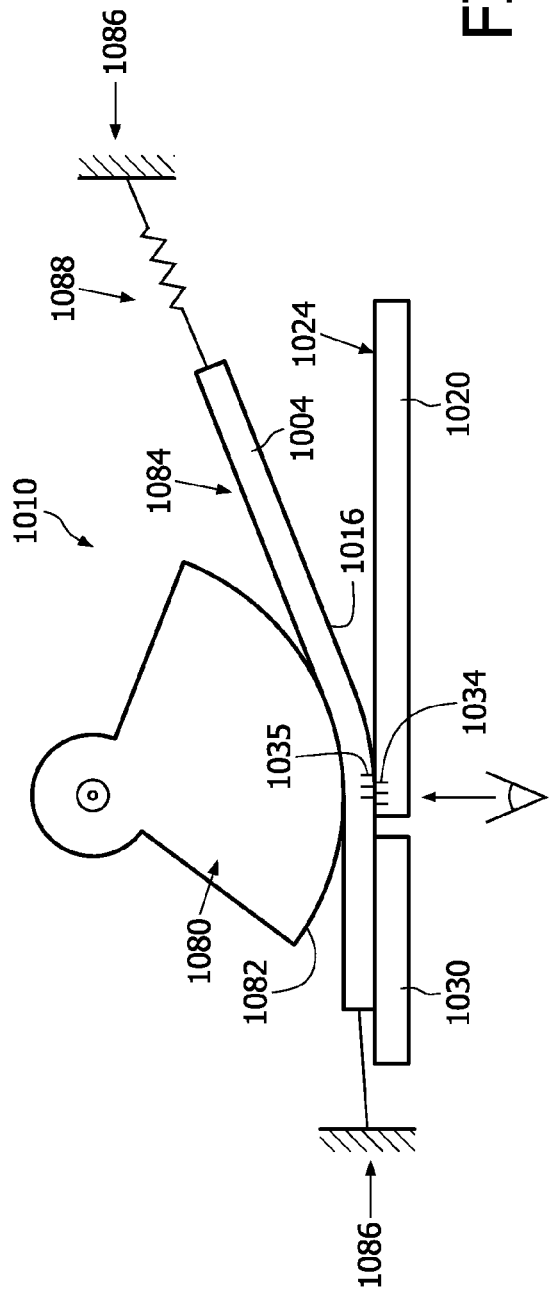

Starting from a situation (FIG. 10A) wherein the flexible sheet 1004 is elastically affixed between construction parts 1086 using a spring 1088, a first stage FIG. 10B is established in using a first contacting process. The process includes establishment of an initial contact between a part of the contact surface 1016 with the anchor surface 1032 by for example displacing the anchor 1030 towards the rolling member 1080 followed by forward rolling of the rolling member 1080 to create the contact between the contact surface 1016 and the surface 1024. The formation of the contact with the anchor is less accurate or reproducible than the contact created using the rolling process. A course mutual alignment of the surfaces 1016, 1024 and 1032 may be performed before establishing the latter contact and is preferable for small scale alignment and fast processing. Using the alignment markers 1035 and 1034 the lateral mismatch is determined between the flexible sheet 1004 and the substrate 1020 using for example optical detection as described here before or using other methods known in the art.

If mismatch is larger than the threshold acceptable, then the rolling is reversed to the extent that the second stage of FIG. 10C is established in which the surface 1016 is released from the surface 1024 but kept attached to the anchor surface 1032. Subsequently, the relative position of the surface 1024 is altered with respect to the anchor, therewith also correcting the mismatch between the surface 1024 and the surface 1016.

In a further step forward rolling is performed to establish the third stage of FIG. 10D wherein the surfaces 1016 and 1024 are in contact again, but this time with improved lateral alignment, as can be optionally checked by determining the lateral misalignment using the alignment markers 1034 and 1035 again.

Figure 11A:
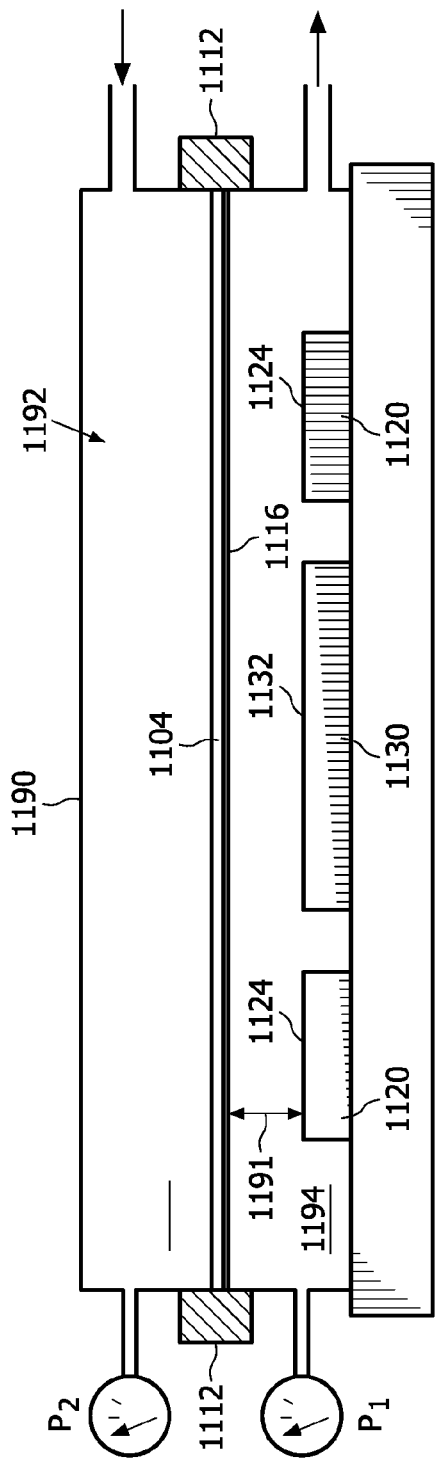

In another embodiment illustrated with reference to FIG. 11, based on a method and apparatus described in U.S. Pat. No. 5,669,303, the method and apparatus includes elastically affixing a flexible sheet 1104 in a holder 1112, such that within a chamber 1190, separated from the surrounding atmosphere, a first compartment 1192 and a second compartment 1194 are formed which are separated by the flexible sheet 1104. An anchor 1130 and one or more, in the present example two, substrates 1120 are disposed in the vicinity of the flexible sheet 1104 such that the anchor surface 1132 and the substrate surface 1124 are substantially parallel to the surface 1116 of the flexible sheet 1104. The apparatus is provided with gas handling equipment suitable for creating over-pressure and/or under-pressure, with respect to atmospheric pressure, in the first and second compartments individually and independently.

Figure 11B:
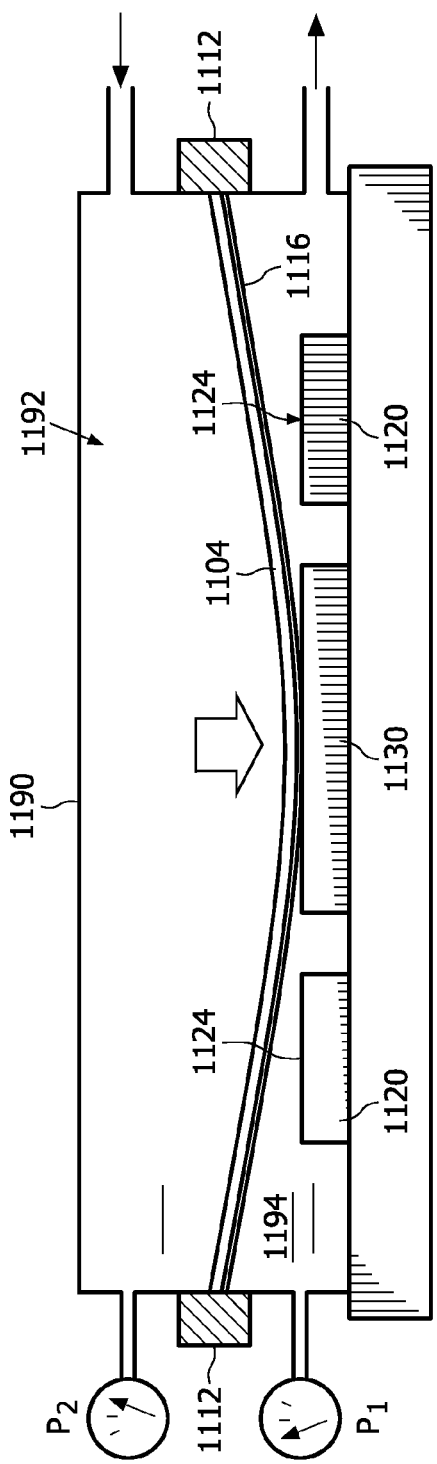
Figure 11C:
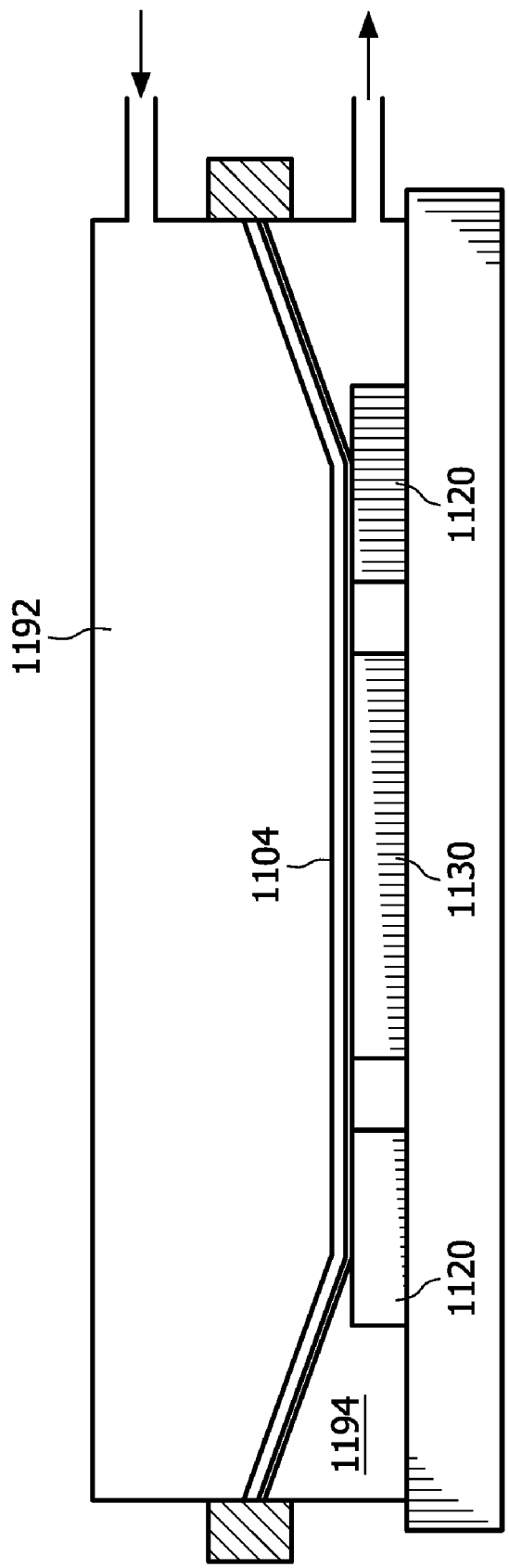

To create a first and initial contact as in FIG. 11B, the first compartment 1192 is provided with an overpressure with respect to the second chamber 1194, causing the flexible sheet 1104 to bow towards the anchor surface 1132 and to make a part of its surface 1116 contact the anchor surface 1132. In the next step further contact between a part of the surface 1116 with the substrate surface 1124 is established in a gradual way by either displacing of the substrate 1120 to decrease the gap 1191, or by increasing the overpressure in the first compartment. A course mutual alignment of the surfaces 1116, 1124 and 1132 is preferably performed before establishing the stage of FIG. 11B.

Using alignment markers as described for previous embodiments the lateral mismatch is determined between the flexible sheet 1104 and the substrate 1120 using for example optical detection as described here before or using other methods known in the art.

If mismatch is larger than the threshold acceptable, then the surface 1116 is made to release from the surface 1124 to obtain the situation of FIG. 11B again by either displacing the substrate 1120 such that the gap 1191 is increased again, or decreasing the pressure difference between the first and second compartments. The surface 1132 is however kept in contact with the anchor surface 1132.

Subsequently, the first relative positions of the surfaces 1124 with respect to the anchor surface 1132 are changed for correcting the possible lateral mismatch. In this case preferably by keeping the anchor stationary and moving the substrates 1120 in order to provide individual correction for every substrate. Not shown are means for effectuating such lateral displacement. They can be provided using state of the art technology and mechanical engineering by for example placing each substrate on a (motorized) stage within the space 1190, which allow moving of the substrates with respect to the holder and anchor. In a next step further contact between the surface 1116 and the surface 1124 is reestablished by the same process as described here before. This results in the third stage depicted in FIG. 11D wherein contact is established with improved alignment.

The advantage of using more than one substrate per anchor is increased throughput with less than proportional cost and effort.

As compared to the method and apparatus described with reference to FIG. 10, those of FIGS. 3 thru 9 and 11 have the advantage of not using moving parts during establishment of contact, therewith reducing inaccuracies introduced with the operation of these parts.

Within the apparatus of FIGS. 3 thru 9 it will be evident that the actuation means in the form of pressurizing nozzles may be replaced by electro mechanical means such as piezoelectrical mechanical actuators or others as described in WO 03/099463 A2.

The apparatuses associated with performing the different processes may vary in their construction considerably based on the different processes used for making initial contact and/or further contact. However, it will be appreciated that the principle of the invention will apply equally well to all of these apparatuses as long as the process for establishment of further contact is more accurate and/or reproducible in terms of lateral alignment than the process for establishment of initial contact. Those skilled in the art will easily find a way of incorporating the essential features according to the invention in the apparatus according to their need.

Summarizing the invention relates to a method for contacting a flexible sheet to a first element with improved lateral alignment. The method includes a step of measuring a first lateral misalignment after establishing a first contact between the flexible sheet and either of the first element and a sheet parking surface called anchor in the first stage. If the misalignment exceeds a predetermined threshold the flexible sheet is parked at the anchor such that it is not in contact with the first element and the relative position of the first element and the anchor is altered during the second stage for correcting the mismatch during a contact between the flexible sheet and the first element to be established within the next step of the method. During the steps of shifting the contact point to obtain the second stage the contacting process is more accurate and reproducible than the process for establishing the initial contact. The invention also relates to an apparatus for executing the method and the use of the method and apparatus for the manufacture of devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element or product does not exclude the presence of a plurality of such elements or products. The mere fact that certain measures are recited in mutually different dependent claims does not indicate that the combination of these measures cannot be used to advantage.

The invention claimed is:

1. Method for contacting of a sheet surface of a flexible sheet and a first contact surface of a first element, comprising the steps of:
    providing an anchor having an anchor surface for contacting the sheet surface, the anchor surface and the first contact surface of the first element having an adjustable first relative lateral position to each other;
    using a first contacting process to establish a first contacting stage of the method wherein at least a first part of the sheet surface is in contact with at least one of the anchor surface and the first contact surface;
    while in the first stage, determining a first lateral misalignment of the sheet surface with respect to at least one of the surfaces with which the sheet surface is in contact;
    confirming the first lateral misalignment by determining whether the first lateral misalignment exceeds a threshold;
    correcting the misalignment by establishing a second contacting stage of the method wherein a part of the sheet surface is in contact with the anchor surface, while no part of the sheet surface is in contact with the first contact surface, the second stage being established in such a manner that at all times between the first and second stages at least a part of the sheet surface is kept in contact with at least one of the anchor surface and the first contact surface;
    while in the second stage, adjusting the first relative lateral position to correct for the first lateral misalignment; and
    using a second contacting process to establish a third contacting stage of the method wherein the sheet surface is in contact with the first contact surface, the second contacting process being more accurate than the first contacting process.

2. Method according to claim 1, wherein the second contacting process includes gradual establishment of the contact such that a contact front, being defined by a borderline between a first area of the sheet surface that is in contact with the anchor surface or the first contact surface and a second area of the sheet surface that is not in contact with any of the respective surfaces, is made to displace in the direction of the second area.

3. Method according to claim 1, wherein the anchor surface includes a first edge and the first contact surface includes a second edge, the first edge and the second edge being adjacent to each other and extending at a distance from each other, the anchor surface at the first edge residing in the same virtual plane as the first contact surface at the second edge at least during performing of the second contacting processes.

4. Method according to claim 3 wherein the first edge comprises a first digitated edge and the second edge comprises a second digitated edge, the digits of the first digitated edge being positioned at least partly in between the digits of the second digitated edge.

5. Method according to claim 1, wherein the flexible sheet has a first lateral thermal expansion coefficient, and the first element has a second lateral thermal expansion coefficient, the difference between the first and second thermal expansion coefficients being less than 5%.

6. Method according to claim 1 wherein, in all stages preceding the third stage, the sheet surface is only in contact with the anchor surface.

7. Method according to claim 1, wherein, in the first stage, the first part of the sheet surface is in contact with at least the first contact surface and the lateral misalignment is determined between the sheet surface and the first contact surface.

8. Method according to claim 1, wherein the lateral misalignment of the sheet surface and any one of the anchor surface and/or the first contact surface is determined from a plurality of positions spaced apart in the lateral directions of the sheet surface.

9. Method according to claim 1, wherein the lateral misalignment is determined at a part of the sheet surface that is in contact with the anchor surface or the first contact surface, and wherein the lateral misalignment is determined from detection of an optical intensity pattern formed by a first alignment marker present within the flexible sheet and a second alignment marker present within at least one of the first element and the anchor, the second alignment marker at least partly overlapping laterally with the first alignment marker.

10. Method according to claim 1, wherein the flexible sheet comprises a template pattern that is transferred to the first element.

11. Method according to claim 10 wherein the template pattern is a relief pattern that is transferred using an embossing, imprinting or micro-contact printing process.

* * * * *